(12) United States Patent
Koyama et al.

(10) Patent No.: US 8,716,746 B2
(45) Date of Patent: May 6, 2014

(54) SEMICONDUCTOR DEVICE

(75) Inventors: Masaki Koyama, Nukata-gun (JP);
Yasushi Ookura, Okazaki (JP); Akitaka Soeno, Toyota (JP); Tatsuji Nagaoka, Aichi-gun (JP); Takahide Sugiyama, Aichi-gun (JP); Sachiko Aoi, Nagoya (JP); Hiroko Iguchi, Aichi-gun (JP)

(73) Assignees: DENSO CORPORATION, Kariya (JP); Toyota Jidosha Kabushiki Kaisha, Toyota (JP)

( * ) Notice: Subject to any disclaimer, the term of this patent is extended or adjusted under 35 U.S.C. 154(b) by 344 days.

(21) Appl. No.: 13/205,845

(22) Filed: Aug. 9, 2011

(65) Prior Publication Data
US 2012/0043581 A1   Feb. 23, 2012

(30) Foreign Application Priority Data

Aug. 17, 2010 (JP) ................. 2010-182356
Sep. 1, 2010 (JP) ................. 2010-195837

(51) Int. Cl.
*H01L 29/66* (2006.01)

(52) U.S. Cl.
USPC ........... 257/140; 257/334; 257/492; 257/493; 257/E29.01

(58) Field of Classification Search
USPC ................. 257/140, 334, 492, 493, E29.201
See application file for complete search history.

(56) References Cited

U.S. PATENT DOCUMENTS

| | | | |
|---|---|---|---|
| 6,069,371 A | 5/2000 | Omura et al. | |
| 7,473,965 B2 | 1/2009 | Terashima | |
| 7,498,634 B2 * | 3/2009 | Tsuzuki et al. | 257/341 |
| 7,737,491 B2 * | 6/2010 | Hotta et al. | 257/330 |
| 7,786,532 B2 | 8/2010 | Terashima | |
| 2005/0017290 A1 | 1/2005 | Takahashi et al. | |
| 2005/0258493 A1 | 11/2005 | Aono et al. | |
| 2007/0170549 A1 | 7/2007 | Tsuzuki et al. | |

(Continued)

FOREIGN PATENT DOCUMENTS

| | | |
|---|---|---|
| JP | A-2003-017700 | 1/2003 |
| JP | 2009-141202 A | 6/2009 |
| JP | 2009-253004 A | 10/2009 |
| JP | 2009-267116 A | 11/2009 |

OTHER PUBLICATIONS

Office Action dated Feb. 28, 2013 in corresponding DE Application No. 10 2011 080 891.4 (and English translation).

(Continued)

*Primary Examiner* — Minh-Loan T Tran
(74) *Attorney, Agent, or Firm* — Posz Law Group, PLC

(57) ABSTRACT

In a semiconductor device, an IGBT cell includes a trench passing through a base layer of a semiconductor substrate to a drift layer of the semiconductor substrate, a gate insulating film on an inner surface of the trench, a gate electrode on the gate insulating film, a first conductivity-type emitter region in a surface portion of the base layer, and a second conductivity-type first contact region in the surface portion of the base layer. The IGBT cell further includes a first conductivity-type floating layer disposed within the base layer to separate the base layer into a first portion including the emitter region and the first contact region and a second portion adjacent to the drift layer, and an interlayer insulating film disposed to cover an end of the gate electrode. A diode cell includes a second conductivity-type second contact region in the surface portion of the base layer.

19 Claims, 25 Drawing Sheets

(56) References Cited

U.S. PATENT DOCUMENTS

| | | |
|---|---|---|
| 2008/0012050 A1 | 1/2008 | Aoki et al. |
| 2008/0048295 A1 | 2/2008 | Takahashi |
| 2008/0315248 A1 | 12/2008 | Tokura et al. |
| 2009/0230500 A1 | 9/2009 | Yoshikawa et al. |
| 2009/0278166 A1 | 11/2009 | Soeno et al. |
| 2010/0090248 A1 | 4/2010 | Kouno |

OTHER PUBLICATIONS

Office Action dated Oct. 18, 2013 in the corresponding CN application No. 2011 1024 1326.X (English translation).

Office action mailed Feb. 12, 2014 in the corresponding JP application No. 2010-182356 (and English translation).

* cited by examiner

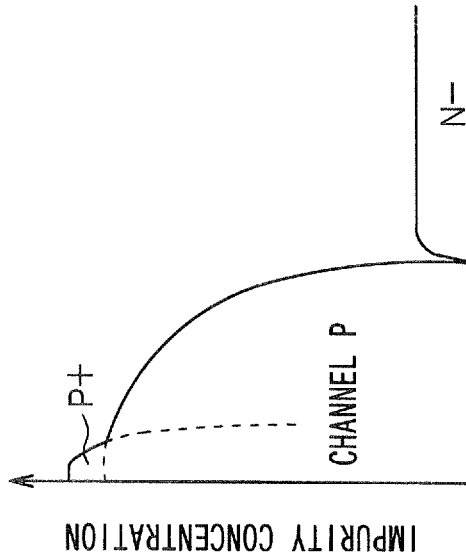
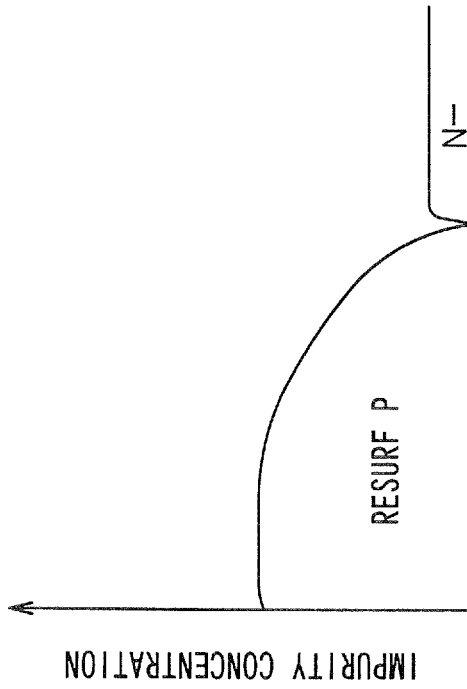

SEMICONDUCTOR DEVICE

CROSS REFERENCE TO RELATED APPLICATION

This application is based on Japanese Patent Applications No. 2010-182356 filed on Aug. 17, 2010 and No. 2010-195837 filed on Sep. 1, 2010, the disclosure of which are incorporated herein by reference.

FIELD OF THE INVENTION

The present invention relates to an insulated gate semiconductor device.

BACKGROUND OF THE INVENTION

A semiconductor device having an insulated gate bipolar transistor (IGBT) cell and a free wheeling diode (FWD) cell in the same semiconductor substrate has been proposed, for example, in JP 2007-214541A corresponding to U.S. 2007/0170549.

In the semiconductor device, for example, a P-type layer is formed in a surface portion of an N-type semiconductor substrate, and an N-type emitter region is formed in a surface portion of the P-type layer. Further, first trenches are formed to reach the N-type semiconductor substrate while passing through the N-type emitter region and the P-type layer. A gate electrode is embedded in each of the first trenches through an insulating film.

Further, a $P^+$-type region deeper than the N-type emitter region is formed between the adjacent first trenches for a contact. A second trench is formed to reach the P-type layer while passing through the $P^+$-type region. An emitter electrode is formed above the N-type semiconductor substrate through an interlayer insulating film that covers the gate electrodes. The emitter electrode is embedded in the second trench. That is, the first trenches are configured to form a trench gate structure, and the second trench is configured to form an emitter contact.

On the rear surface of the N-type semiconductor substrate, a $P^+$-type collector region and an $N^+$-type cathode region are formed. Further, a collector electrode is formed commonly on the $P^+$-type collector region and the $N^+$-type cathode region. In such a structure, a section including the $P^+$-type collector region serves as an IGBT element, and a section including the $N^+$-type cathode region serves as a diode element.

In the section of the diode element, that is, in a diode cell, the emitter electrode embedded in the second trench serves as an anode electrode of the diode cell. The inside of the P-type layer to which the anode electrode is connected has an impurity concentration lower than that of the $P^+$-type region. When the diode cell is operated, excessive hole injection from the IGBT cell to the diode cell is restricted. As a result, a recovery characteristic of the diode cell is improved.

In the semiconductor device, however, since the second trench passes through the $P^+$-type region and reaches the P-type layer, between the adjacent first trenches. Therefore, it is necessary to form the $P^+$-type region deeper than the N-type emitter region so that the $P^+$-type region can contact the emitter electrode formed in the second trench. Further, since the $P^+$-type region is located between the first trench and the second trench, a clearance of the $P^+$-type region for reducing an influence on a threshold voltage Vt of the IGBT is very small.

Such a drawback also arises in a semiconductor device having a P-type semiconductor substrate.

Further, in the semiconductor device of JP 2007-214541, the P+-type region that contacts the emitter electrode in the diode cell has an impurity concentration to determine the threshold voltage Vt of a channel region of the IGBT cell. The impurity concentration is too high as the impurity concentration of the anode of the diode element.

Therefore, JP 2007-214541A also proposes to form a P-type anode region with an impurity concentration lower than that of the P-type region of the IGBT cell without forming the first trenches and the second trench in the diode cell. The P-type anode region is formed by using a separate mask in a special process. In such a structure, hole injection to the semiconductor substrate is restricted, and hence a desirable diode characteristic can be achieved.

In the structure having the special P-type anode region in the diode cell, however, hole injection from the IGBT cell to the diode cell relatively increases. As a result, a forward voltage Vf will be shifted, and a reverse recovery capacity will be reduced. Further, a sectional structure of the diode cell is different from that of the IGBT cell. Therefore, an electric field is likely to concentrate adjacent to the bottom of the trench located at an end of the IGBT cell, resulting in the degradation of withstand voltage.

SUMMARY OF THE INVENTION

The present invention is made in view of the foregoing matter, and it is an object of the present invention to provide a semiconductor device capable of restricting excessive hole injection from an IGBT cell to a diode cell. It is another object of the present invention to provide a semiconductor device without having a trench for an emitter contact between trenches for a trench gate structure, capable of restricting excessive hole injection from an IGBT cell to a diode cell when a diode is operated. It is further another object of the present invention to provide a semiconductor device capable of reducing hole injection from the IGBT element region to the diode element region while ensuring a withstand voltage.

In a semiconductor device according to an aspect, a semiconductor substrate includes a first conductivity-type drift layer and a second conductivity-type base layer disposed on the drift layer, in which a surface of the drift layer opposite to the base layer defines a first surface of the semiconductor substrate and a surface of the base layer opposite to the drift layer defines a second surface of the semiconductor substrate. A second conductivity-type collector layer is disposed adjacent to the second surface of the semiconductor substrate. A first conductivity-type cathode layer is disposed adjacent to the second surface of the semiconductor substrate at a same level as the collector layer. A collector electrode is disposed on the collector layer and the cathode layer. In the semiconductor device, a section of the semiconductor substrate including the collector layer with respect to a direction along the first surface constitutes an IGBT cell operating as an IGBT element, and a section of the semiconductor substrate including the cathode layer with respect to the direction along the first surface constitutes a diode cell operating as a diode element. The IGBT cell includes a trench, a gate insulating film, a gate electrode, a first conductivity-type emitter region, a second conductivity-type first contact region, a first conductivity-type floating layer and an interlayer insulating film. The trench passes through the base layer and reaches the drift layer. The gate insulating film is disposed on an inner surface of the trench. The gate electrode is disposed on the gate insulating film within the trench. The first conductivity-type emitter region is disposed in a surface portion of the base layer and contacts a side surface of the trench within the base layer. The second conductivity-type first contact region is disposed in the surface portion of the base layer. The first conductivity-type floating layer is disposed within the base layer at a location deeper than the emitter region and the first contact region with respect to a depth of the trench. The floating layer separates the base layer into a first portion including the emitter region and the first contact region and a second portion adjacent to the drift layer. The interlayer insulating film disposed to cover an end of the gate electrode. The diode cell includes a second conductivity-type second contact region disposed in the surface portion of the base layer. The IGBT cell and the diode cell further include an emitter electrode that is electrically connected to the emitter region, the first contact region and the second contact region.

In such a structure, the floating layer disposed in the base layer of the IGBT cell serves as a potential wall. When the IGBT is operated, a flow of holes from the drift layer to the base layer is reduced. Therefore, it is less likely that the holes will be discharged to the emitter electrode. With this, the concentrations of holes and electrons in the drift layer increases, and hence conductivity modulation enhances. As a result, the resistance of the drift layer reduces, and thus steady loss of the IGBT cell reduces.

Also, when the diode cell is operated, the flow of holes from the first contact region of the IGBT cell toward the diode cell through the drift layer is restricted by the floating layer. Therefore, excessive hole injection from the IGBT cell to the diode cell is restricted. Accordingly, a change in forward voltage of the diode cell due to gate interference of the IGBT cell is restricted.

In this way, even in a structure without having a trench for an emitter contact between trenches of the trench gate structure excessive hole injection from the IGBT cell to the diode cell is restricted when the diode cell is operated.

In a semiconductor device according to another aspect, a semiconductor substrate defines a first surface and a second surface, and includes a first conductivity-type drift layer. A second conductivity-type collector layer is disposed adjacent to the second surface of the semiconductor substrate. A first conductivity-type cathode layer is disposed adjacent to the second surface of the semiconductor substrate at a same level as the collector layer. A collector electrode is disposed on the collector layer and the cathode layer. In the semiconductor device, a section of the semiconductor substrate including the collector layer with respect to a direction along the first surface constitutes an IGBT cell operating as an IGBT element, and a section of the semiconductor substrate including the cathode layer with respect to the direction along the first surface constitutes a diode cell operating as a diode element. The IGBT cell includes a second conductivity-type channel layer, a trench, a gate insulating film, a gate electrode, a first conductivity-type emitter region, a second conductivity-type first contact region, a first conductivity-type floating layer, and an interlayer insulating film. The second conductivity-type channel layer is disposed on the drift layer. The trench passes through the channel layer and reaches the drift layer. The gate insulating film is disposed on an inner surface of the trench. The gate electrode is disposed on the gate insulating film within the trench. The first conductivity-type emitter region is disposed in the surface portion of the channel layer and contacts a side surface of the trench within the channel layer. The second conductivity-type first contact region is disposed in the surface portion of the channel layer. The first conductivity-type floating layer is disposed in the channel layer at a location deeper than the emitter region and the first contact region. The floating layer separates the floating layer into a first portion including the emitter region and the first contact region and a second portion adjacent to the drift layer. The interlayer insulating film is disposed to cover an end of the gate electrode. The diode cell includes a second conductivity-type RESURF region and a second conductivity-type second contact region. The second conductivity-type RESURF region has an area density lower than that of the channel layer and has a depth greater than that of the trench at least at a location adjacent to a boundary between the IGBT cell and the diode cell. The RESURF region serves as an anode. The second conductivity-type second contact region is disposed in a surface portion of the RESURF region.

In such a structure, since the diode cell has the RESURF region deeper than the trench, a depletion layer formed in the drift layer by the channel layer and a depletion layer formed in the drift layer by the RESURF layer are smoothly connected to each other at a location adjacent to a boundary between the IGBT cell and the diode cell. With this, the field intensity at the location adjacent to the boundary becomes smooth. Therefore, the field concentration is reduced, and a withstand voltage is ensured.

In addition, since the floating layer disposed in the channel layer of the IGBT cell serves as the potential wall, the flow of holes from the drift layer to the channel layer is restricted when the IGBT cell is operated. Therefore, it is less likely that the holes will be discharged to the emitter electrode. Since the hole concentration and the electron concentration increase, the conductivity modulation enhances. Accordingly, the resistance of the drift layer reduces, and the steady loss of the IGBT cell reduces.

When the diode cell is operated, the flow of holes from the first contact region of the IGBT cell toward the diode cell is blocked by the floating layer. Therefore, the excessive hole injection from the IGBT cell to the diode cell is restricted. Accordingly, the change in forward voltage of the diode cell due to the gate interference of the IGBT cell is restricted.

BRIEF DESCRIPTION OF THE DRAWINGS

Other objects, features and advantages of the present invention will become more apparent from the following detailed description made with reference to the accompanying drawings, in which like parts are designated by like reference numbers and in which:

FIG. 19A is a profile of the semiconductor device taken along a line XIXA-XIXA in FIG. 18B;

FIG. 19B is a profile of the semiconductor device taken along a line XIXB-XIXB in FIG. 18B;

DETAILED DESCRIPTION OF EXEMPLARY EMBODIMENTS

Hereinafter, exemplarily embodiments of the present invention will be described with reference to the drawings. Like parts are designated with like reference numbers throughout the embodiments.

In the embodiments, for example, N-type, $N^+$-type and $N^-$-type correspond to a first conductivity-type, and P-type, $P^+$-type and $P^-$-type correspond to a second conductivity-type.

First Embodiment

A first embodiment of the present invention will be hereinafter described with reference to FIGS. 1 and 2. An insulated gate semiconductor device according to the present embodiment is, for example, used as a power switching device of a power supply circuit, such as an inverter and a DC/DC converter.

Figure 1:
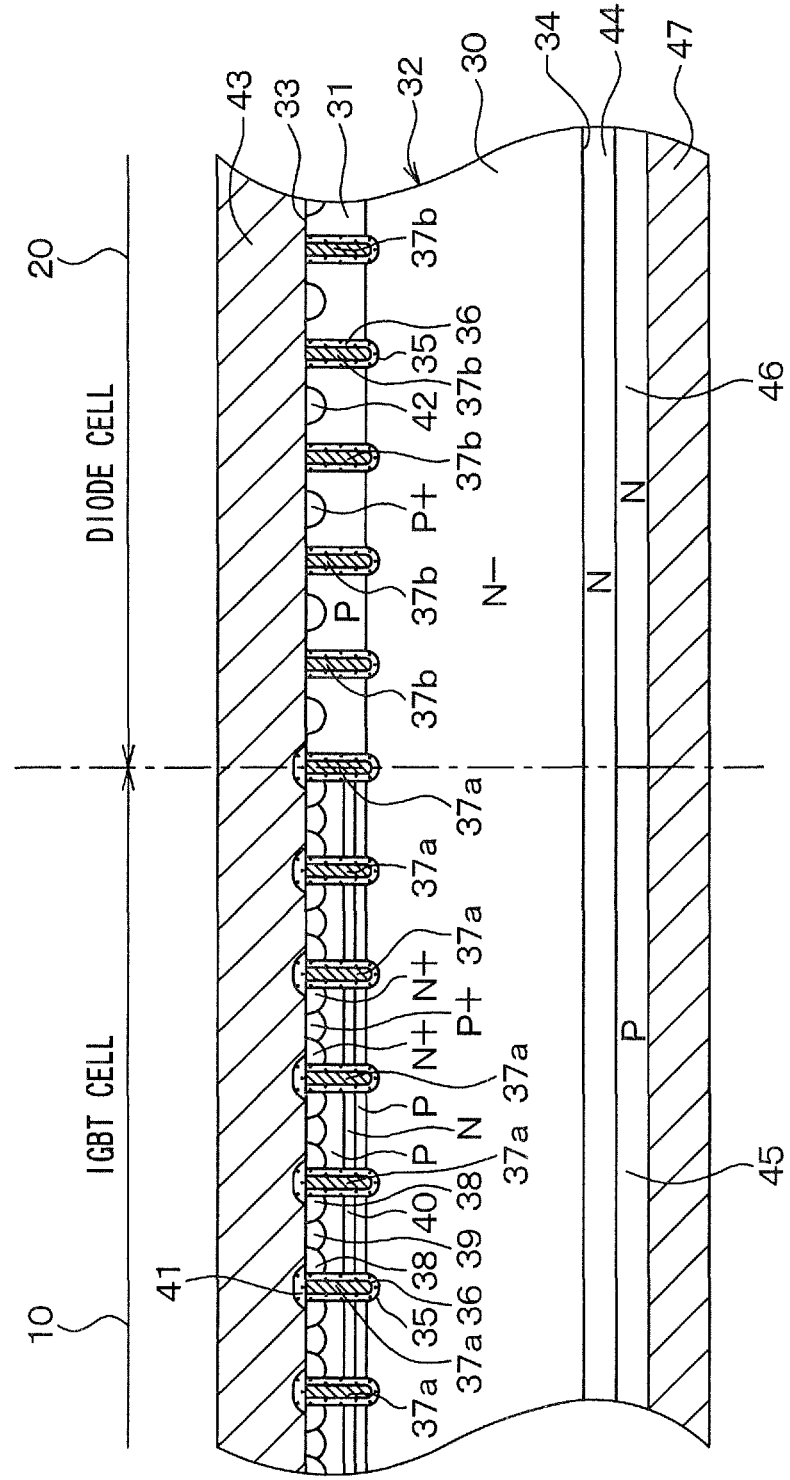
FIG. 1 is a cross-sectional view of a semiconductor device according to a first embodiment of the present invention.

FIG. 1 is a cross-sectional view of a part of the semiconductor device according to the present embodiment. Referring to FIG. 1, the semiconductor device is a reverse conducting-insulated gate bipolar transistor (RC-IGBT) having an IGBT cell 10 and a diode cell 20 adjacent to the IGBT cell 10. The IGBT cell 10 forms a section in which multiple IGBT elements are formed, and the diode cell 20 forms a section in which a diode element is formed. Although not illustrated, multiple IGBT cells 10 and diode cells 20 are alternately disposed.

The IGBT cell 10 and the diode cell 20 commonly have a semiconductor substrate 32. The semiconductor substrate 32 has an $N^-$-type drift layer 30 and a P-type base layer 31 formed on the drift layer 30. In the present embodiment, a surface of the base layer 31 corresponds to a first surface 33 of the semiconductor substrate 32 and a surface of the drift layer 30 opposite to the base layer 31 corresponds to a second surface 34 of the semiconductor substrate 32.

In each of the IGBT cell 10 and the diode cell 20, multiple trenches 35 are formed to pass through the base layer 31 and reach the drift layer 30. Each of the trenches 35 extends in a direction along the first surface 33 of the semiconductor substrate 32, such as a longitudinal direction of the surface 33. Here, the longitudinal direction corresponds to a direction perpendicular to an alignment direction of the IGBT cell 10 and the diode cell 20. That is, the longitudinal direction corresponds to a direction perpendicular to a paper surface of FIG. 1. For example, the trenches 35 are disposed parallel to each other at equal intervals.

A gate insulating film 36 is formed on an inner surface of each trench 35. The gate insulating film 36 covers the inner surface of the trench 35. A gate electrode 37a, which is polysilicon or the like, is embedded on the gate insulating film 36 within the trench 35 of the IGBT cell 10. The gate electrode 37a embedded in the trench 35 through the gate insulating film 36 constitutes a trench gate structure.

On the other hand, a trench electrode 37b is embedded on the gate insulating film 36 within the trench 35 of the diode cell 20. The trench electrode 37b is made of a polysilicon or the like. The gate electrode 37a and the trench electrode 37b extend in the longitudinal direction of the trenches 35.

In the IGBT cell 10, the base layer 31 provides a channel region. Therefore, the base layer 31 of the IGBT cell 10 can be also referred to as a channel layer. $N^+$-type emitter regions 38 are formed in a surface portion of the base layer 31. Also, $P^+$-type first contact regions 39 are formed in the surface portion of the base layer 31. Each first contact region 39 is disposed between the adjacent emitter regions 38.

The $N^+$-type emitter region 38 has an impurity concentration higher than that of the $N^-$-type drift layer 30. The emitter region 38 is ended within the base layer 31. Further, the emitter region 38 is in contact with the side surface of the first trench 35a within the base layer 31. The $P^+$-type first contact region 39 has an impurity concentration higher than that of the $P^+$-type base layer 31. Similar to the emitter region 38, the first contact region 39 is ended within the base layer 31.

For example, the emitter region 38 is extended in a bar shape in the longitudinal direction of the trench 35. The emitter region 38 is disposed along the side surface of the trench 35, and is ended without beyond the end of the trench 35 with respect to the longitudinal direction of the trenches 35. That is, the end of the emitter region 38 is located inside of the end of the trench 35 with respect to the longitudinal direction of the trench 35.

The first contact region 39 is extended in a bar shape in the longitudinal direction of the trench 35. The first contact region 39 is disposed between the adjacent two emitter regions 38 and is extended along the emitter regions 38.

In the IGBT cell 10, the base layer 31 is formed with an N-type floating layer 40. The floating layer 40 is disposed at a location deeper than the emitter regions 38 and the first contact regions 39 with respect to the first surface 33 of the base layer 31 and laid to separate the base layer 31. Specifically, the floating layer 40 is disposed to separate the base layer 31 into a first portion (e.g., upper region in FIG. 1) in which the emitter regions 38 and the first contact regions 39 are formed and a second portion (e.g., lower region in FIG. 1) that contacts the drift layer 30. In the present embodiment, the floating layer 40 is formed only in the base layer 31 of the IGBT cell 10, and is not formed in the base layer 31 of the diode cell 20.

Further, an interlayer insulating film 41, such as phospho silicate glass (PSG) film, is formed on the base layer 31. The interlayer insulating film 41 covers ends of the gate electrodes 37a (e.g., upper ends of the gate electrodes 37a in FIG. 1). The emitter regions 38 are partly exposed from the interlayer insulating film 41. Also, the first contact regions 39 are exposed from the interlayer insulating film 41. The gate electrodes 37a are connected to pads (not shown) that are provided for the gate.

In the diode cell 20, P+-type second contact regions 42 are formed in the surface portion of the base layer 31. The second contact regions 42 have an impurity concentration different from that of the first contact regions 39 of the IGBT cell 10. That is, the second contact regions 42 have the impurity concentration that is optimum to a diode characteristic. In the present embodiment, the diode cell 20 do not have the interlayer insulating film 41 that is disposed on the base layer 31 in the IGBT cell 10.

An emitter electrode 43 is formed along the base layer 31 in both of the IGBT cell 10 and the diode cell 20. In the IGBT cell 10, the emitter electrode 43 is located on the exposed portions of the emitter regions 38 that are exposed from the interlayer insulating film 41 and the first contact regions 39 to electrically connect with the emitter regions 38 and the first contact regions 39. In the diode cell 20, the emitter electrode 43 is located on the base layer 31 and the second contact regions 42 to electrically connect with the base layer 31 and the second contact regions 42.

Further, in the diode cell 20, the emitter electrode 43 is also located on the gate insulating films 36 exposing from the trenches 35 and the trench electrodes 37b. Therefore, the trench electrodes 37b electrically connected to the emitter electrode 43 to provide an emitter-ground type.

An N-type field stop layer 44 is formed along the second surface 34 of the semiconductor substrate 32. In the IGBT cell 10, a P-type collector 45 is formed on the field stop layer 44. In the diode cell 20, an N-type cathode layer 46 is formed on the field stop layer 44. The collector layer 45 and the cathode layer 46 are formed at the same level. Further, a collector electrode 47 is formed on the collector layer 45 and the cathode layer 46.

In such a structure, one of the trenches 35 is located on a boundary line between the collector layer 45 and the cathode layer 46. The trench 35 located on the boundary line is hereinafter referred to as the boundary trench 35. The section of the IGBT cell 10 and the section of the diode cell 20 are divided from each other at the boundary trench 35. That is, the boundary trench 35 defines a boundary between the region of the IGBT cell 10 and the region of the diode cell 20. In the present embodiment, the gate electrode 37a is embedded in the boundary trench 35.

The gate electrode 37a embedded in the boundary trench 35 is electrically insulated from the emitter electrode 43 by the interlayer insulating film 41. Therefore, the gate electrode 37a embedded in the boundary trench 35 serves as a part of the IGBT element.

Next, a manufacturing method of the aforementioned insulated gate semiconductor device will be described. First, an N-type silicone wafer for the drift layer 30 is prepared. The P-type base layer 31 is formed on the surface of the silicone wafer such as by a heat diffusion technique. Then, the N-type floating layer 40 is formed in a region of the base layer 31 corresponding to the IGBT cell 10 by high-energy ion implantation and heat treatment using a mask having an opening corresponding to the region where the IGBT cell 10 is to be formed.

Likewise, the N+-type emitter regions 38, the P+-type first contact regions 39, and the P+-type second contact regions 42 are formed by ion implantation and heat treatment using a mask having openings at respective positions. In this case, with regard to the first contact regions 39 and the second contact regions 42, the respective dose of the ion implantation is adjusted so that the first contact regions 38 and the second contact regions 39 respectively have impurity concentrations optimum for the IGBT element and the diode element.

Thereafter, the trench gate structure is formed in the silicone wafer. The trench gate structure may be formed in a known process. Here, the trenches 35 are formed to pass through the base layer 31 and reach the N−-type drift layer 30. Further, the gate insulating film 36, such as SiO$_2$ film, is formed on the inner surface of each trench 35. In the IGBT cell 10, the polysilicon as the gate electrode 37a is formed on the gate insulating film 36. In the diode cell 20, the polysilicon as the trench electrode 37b is formed on the gate insulating film 36. The gate electrode 37a and the trench electrode 37b are formed in the same step.

Next, the interlayer insulating film 41 such as the PSG film is formed on the base layer 31. In the IGBT cell 10, contact holes are formed in the interlayer insulating film 41 such that the portions of the N+-type emitter regions 38 and the first contact regions 39 are exposed from the interlayer insulating film 41. In this way, the gate electrodes 37a are covered with the interlayer insulating film 41. The interlayer insulating film 41 formed on the base layer 31 of the diode cell 20 is fully removed, so the trench electrode 37b are exposed from the base layer 31. Thereafter, the emitter electrode 43 is formed entirely over the base layer 31 of the IGBT cell 10 and the diode cell 20, such as with aluminum. Thus, the interlayer insulating film 41 of the IGBT cell 10 is covered with the emitter electrode 43.

The N-type field stop layer 44 is formed on the rear surface of the wafer. Further, the collector layer 45 is formed on a region of the field stop layer 44 corresponding to the IGBT cell 10, and the N-type cathode layer 46 is formed on a region of the field stop layer 44 corresponding to the diode cell 20. Then, the collector electrode 47 is formed on the collector layer 45 and the cathode layer 46, such as with aluminum.

Thereafter, the wafer is cut into chips. The semiconductor device is provided by the chip. The outer portions and the pads for electrical connection with external devices of the IGBT cell 10 and the diode cell 20 may be formed in the aforementioned process or in special steps.

Figure 2:
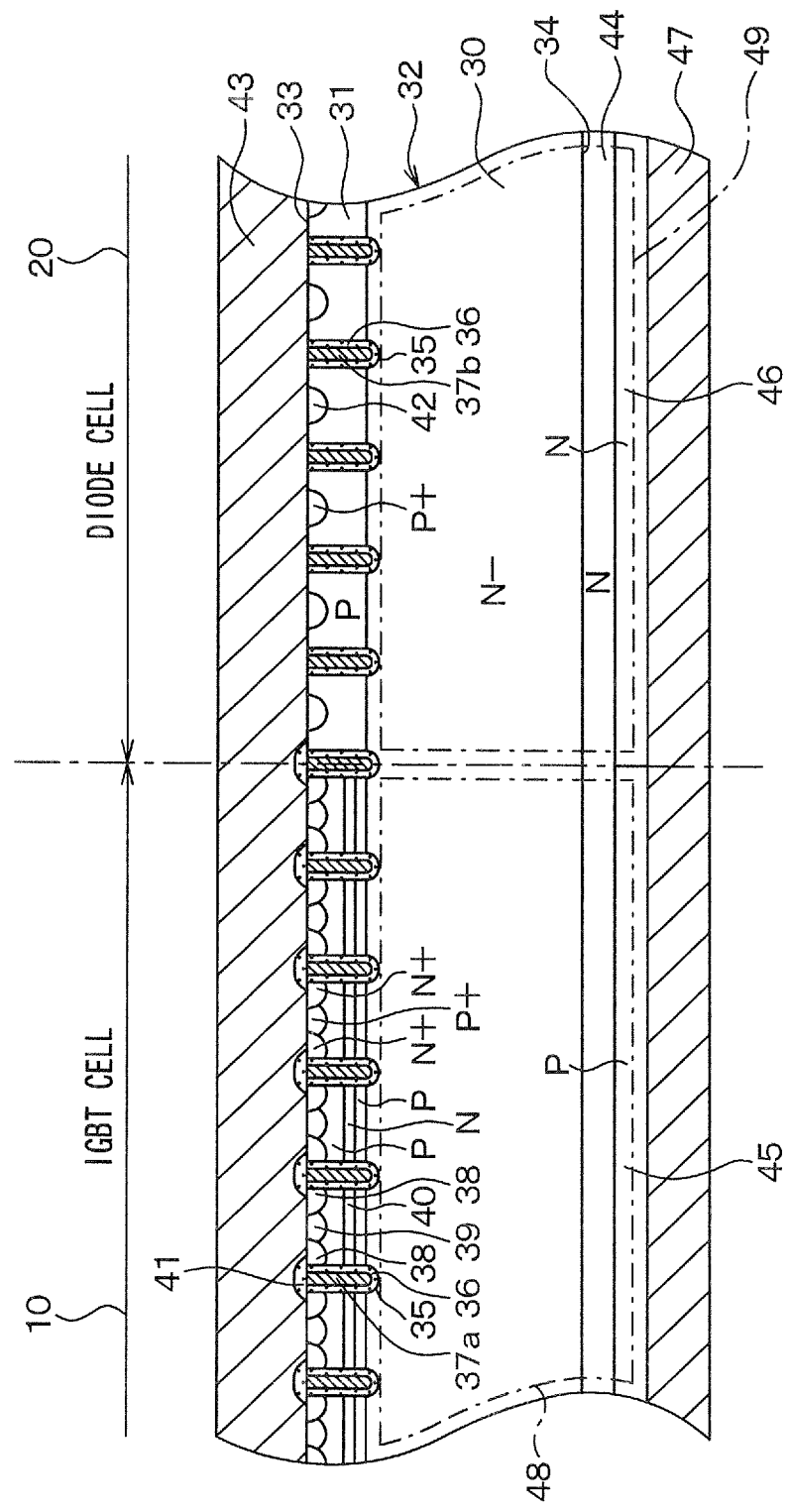
FIG. 2 is a cross-sectional view of the semiconductor device for illustrating an IGBT operation region and a diode operation region according to the first embodiment.

FIG. 2 is a cross-sectional view for illustrating an IGBT operation region 48 and a diode operation region 49. In FIG. 2, the IGBT operation region 48 and the diode operation region 49 are illustrated in the drift layer 30.

As described above, the gate electrode 37a disposed in the boundary trench 35 serves as the IGBT element. Therefore, the section including the collector layer 45 with respect to the direction along the first surface 33 of the semiconductor substrate 32 serves as the IGBT operation region 48 operating as the IGBT element, and the section including the cathode layer 46 with respect to the direction along the first surface 33 serves as the diode operation region 49 operating as the diode element.

Namely, in the IGBT cell 10, the region up to the boundary line between the collector layer 45 and the cathode layer 46 can serve as the IGBT element. Likewise, in the diode cell 20, the region up to the boundary line can serve as the diode element.

As described above, in the IGBT cell 10, the base layer 31 is provided with the floating layer 40. Because the floating layer 40 serves as a potential wall, the floating layer 40 restricts holes from flowing from the drift layer 30 to the base layer 31 when the IGBT cell 10 is operated. As such, the holes are hardly discharged to the emitter electrode 43 from the drift layer 30. As a result, the concentrations of holes and electrons of the drift layer 30 increase, enhancing a conductivity modulation. In such a case, because the resistance of the drift layer 30 reduces, steady loss of the IGBT cell 10 reduces.

When the diode cell 20 is operated, the floating layer 40 blocks the flow of holes from the first contact regions 39 of the IGBT cells 10 toward the diode cell 20 through the drift layer 30. Therefore, it is less likely that the holes will be excessively injected from the IGBT cell 10 to the diode cell 20. Accordingly, the change in forward voltage Vf of the diode cell 20 due to gate interference of the IGBT cell 10 is reduced.

In this way, when the IGBT cell 10 is operated, the flow of holes from the drift layer 30 to the base layer 31 is blocked by the floating layer 40. When the diode cell 20 is operated, the flow of holes from the first contact regions 39 (i.e., the IGBT cell 10) to the diode cell 20 is blocked by the floating layer 40. That is, even though the trench for emitter contact is not provided between the trenches 35 constituting the trench gate structure in the IGBT cell 10, the excessive hole injection from the IGBT cell 10 to the diode cell 20 can be restricted when the diode cell 20 is operated.

Further, since the trench for the emitter contact is not necessary, it is not necessary to form the trench for the emitter contact between the adjacent trenches 35. That is, the etching process is eased, and manufacturing costs are reduced. Further, the causes of process fluctuations can be reduced.

The impurity concentration of the first contact regions 39 is adjusted to a predetermined concentration to determine the threshold voltage Vt of the channel region. Therefore, the impurity concentration of the first contact regions 39 is too high as the concentration for the anode of the diode element. In the present embodiment, however, the impurity concentration of the second contact regions 42 of the diode cell 20 is different from that of the first contact regions 39 of the IGBT cell 10. Therefore, the diode characteristic is not determined by the impurity concentration of the first contact regions 39 of the IGBT cell 10. As such, the impurity concentration of the second contact regions 42 can be adjusted to an optimum concentration as the anode.

Second Embodiment

A second embodiment will be described with reference to FIGS. 3 through 5. Hereinafter, a structure different from the structure of the first embodiment will be mainly described.

Figure 3:
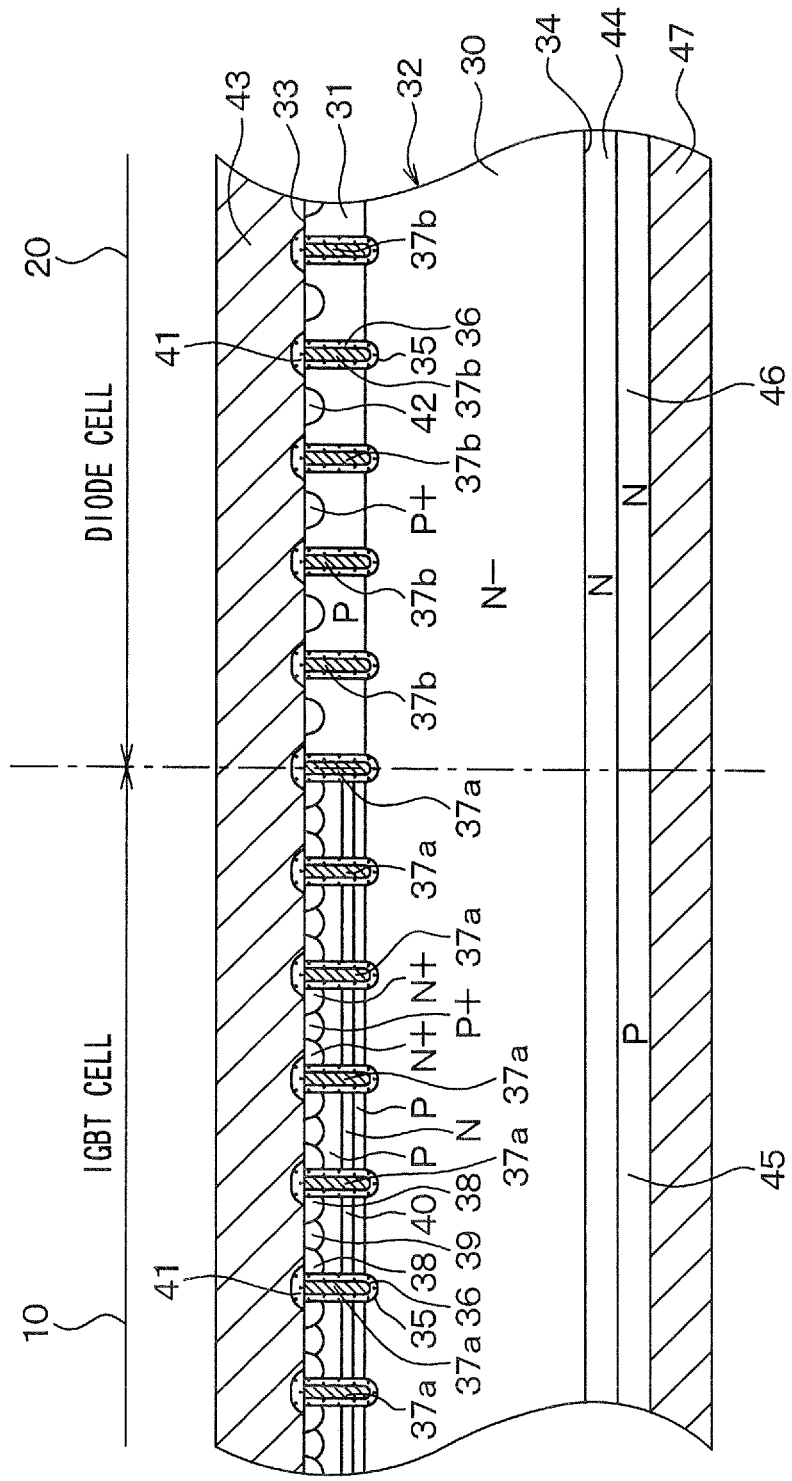
FIG. 3 is a cross-sectional view of a semiconductor device according to a second embodiment of the present invention.

FIG. 3 is a cross-sectional view of a semiconductor device according to the present embodiment. FIG. 4 is a plan view of an outer portion of the semiconductor device according to the present embodiment. FIG. 5 is a cross-sectional view taken along a line Va-Vb-Vc in FIG. 4. In FIG. 5, the collector electrode 47 is not illustrated for the purpose of simplicity.

Referring to FIG. 3, the interlayer insulating film 41 is formed on the base layer 31 of the diode cell 20, in addition to the base layer 31 of the IGBT cell 10. The interlayer insulating film 41 covers ends (e.g., upper ends in FIG. 3) of the trench electrodes 37b. In the diode cell 20, therefore, the trench electrodes 37b and the emitter electrode 43 are electrically insulated from each other by the interlayer insulating film 41. For example, the trench electrodes 37b and the emitter electrode 43 are not directly connected to each other.

Figure 4:
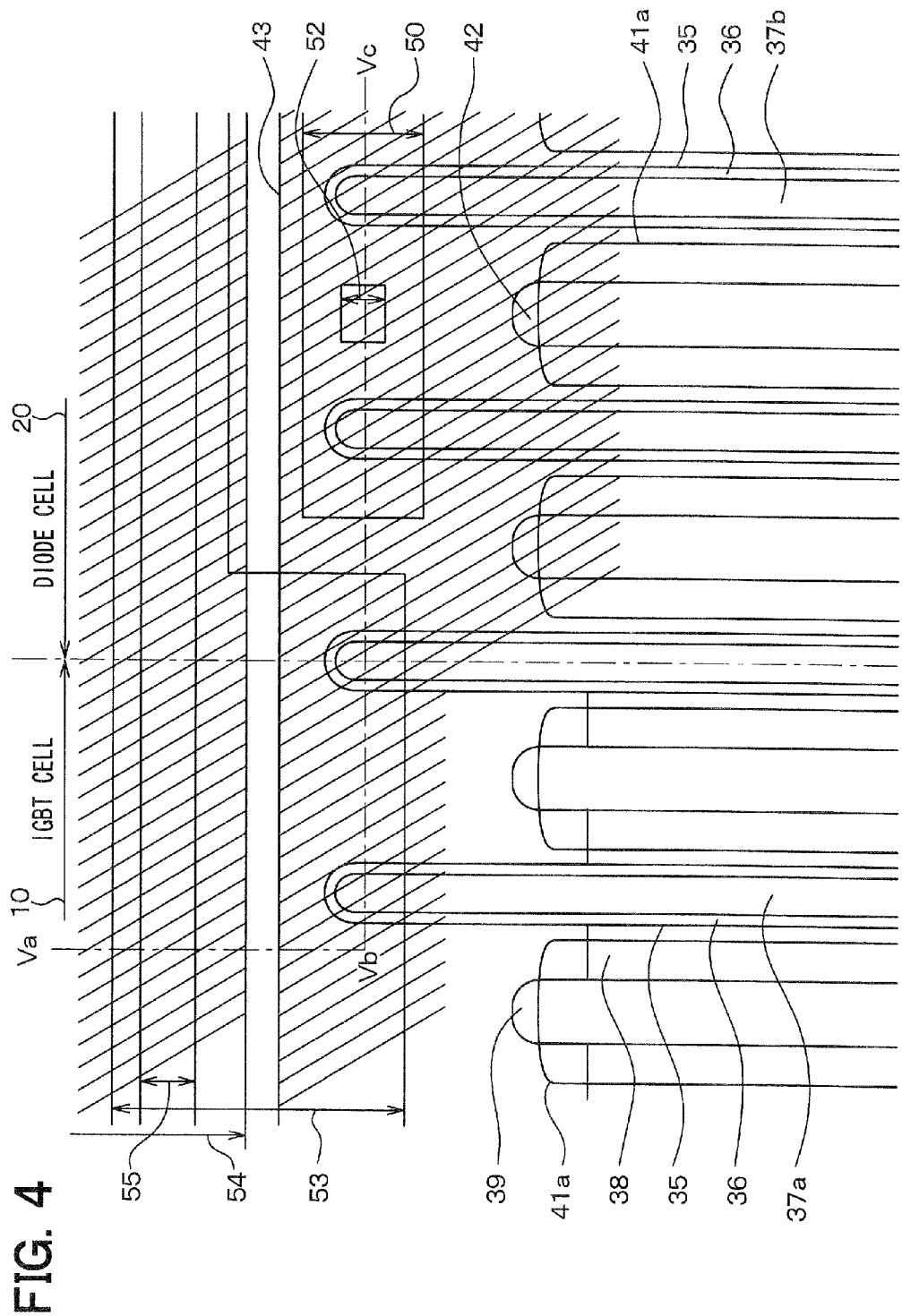
FIG. 4 is a plan view of a part of the semiconductor device shown in FIG. 3.

Referring to FIG. 4, although not illustrated in the first embodiment, the emitter electrode 43 is connected to the emitter regions 38 and the first contact regions 39 of the IGBT cell 10 through contact holes 41a formed in the interlayer insulating film 41. The emitter electrode 43 is also connected to the second contact regions 42 of the diode cell 20 through the contact holes 41a of the interlayer insulating film 41.

The trench electrodes 37b are electrically connected to the emitter electrode 43 at the outer portion of the semiconductor device. For example, as shown in FIG. 4, an emitter leading electrode 50 is formed in the region of the diode cell 20. The emitter leading electrode 50 covers the ends of the trenches 35. Hereinafter, the ends of the trenches 35 with respect to the longitudinal direction of the trenches 35 are also referred to as longitudinal ends.

Figure 5:
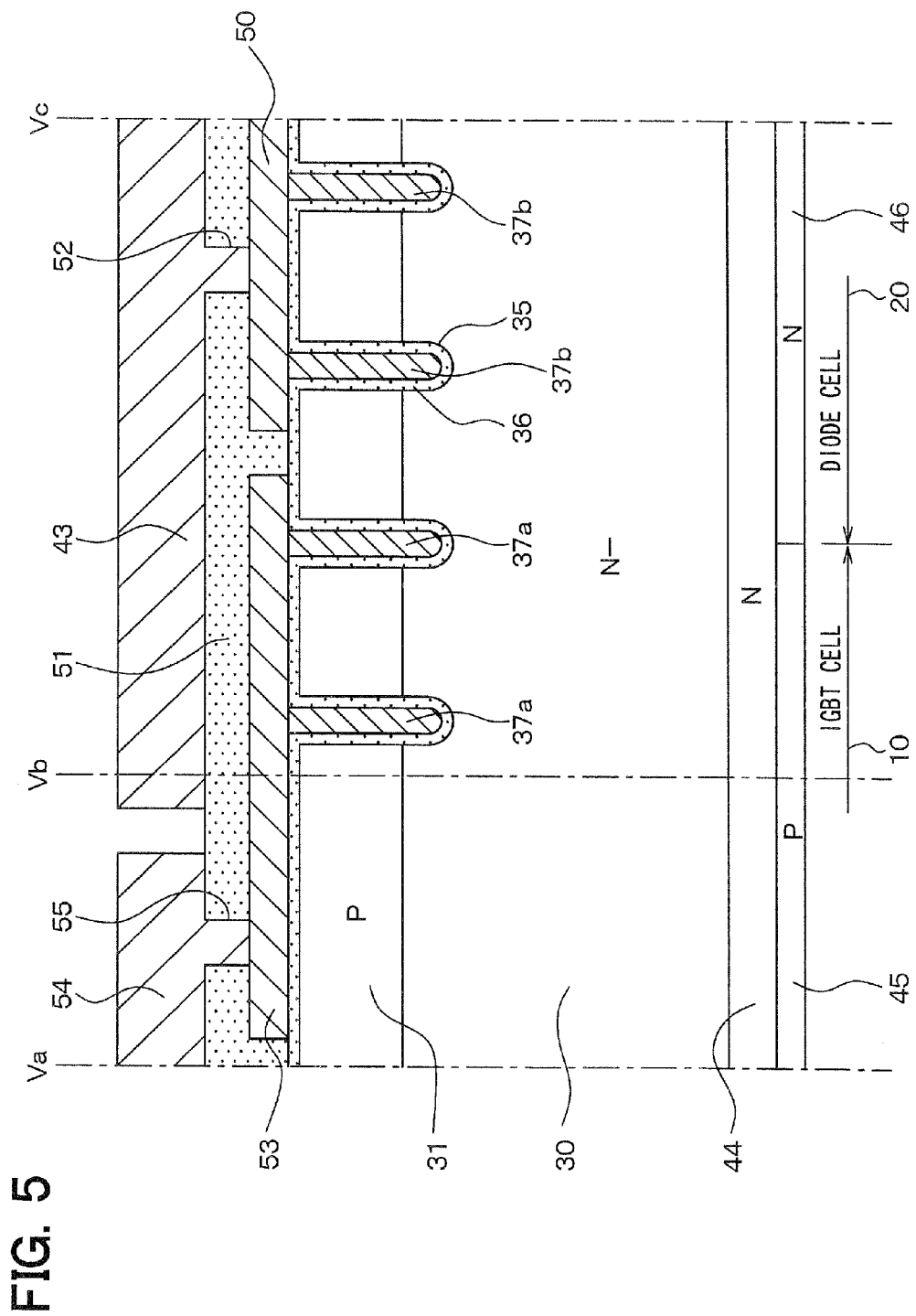
FIG. 5 is a cross-sectional view taken along a line Va-Vb-Vc in FIG. 4.

As shown in FIG. 5, the emitter leading electrode 50 is formed on the trench electrodes 37b embedded in the trenches 35, and is electrically connected to the trench electrodes 37b. Further, an insulating layer 51 is formed on the emitter leading electrode 50. The emitter electrode 43 is formed on the insulating layer 51.

The emitter leading electrode 50 and the emitter electrode 43 are electrically connected to each other through a contact hole 52 of the insulating layer 51. As such, the trench electrodes 37b are electrically connected to the emitter electrode 43 through the emitter leading electrode 50.

In the IGBT cell 10, as shown in FIG. 4, a gate leading electrode 53 is formed to cover the longitudinal ends of the trenches 35 in which the gate electrodes 37a are embedded. The gate leading electrode 53 is extended to a location outside of the region where the trenches 35 are formed.

As shown in FIG. 5, the gate leading electrode 53 is formed on the gate electrodes 37a embedded in the trenches 35, and is electrically connected to the gate electrodes 37a. Further, the insulating layer 51 is formed on the gate leading electrode 53. A gate metal electrode 54 is formed on the insulating layer 51.

The gate leading electrode 53 and the gate metal electrode 54 are electrically connected to each other through a contact hole 55 of the insulating layer 51. As such, the gate electrodes 37a are electrically connected to the gate metal electrode 54 through the gate leading electrode 53.

As described above, the trench electrodes 37b of the diode cell 20 can be electrically connected to the emitter electrode 43 at the outer portion of the diode cell 20. In such a structure, the step of fully removing the interlayer insulating film 41 from the diode cell 20 is not required. Therefore, the manufacturing process is simplified.

Third Embodiment

A third embodiment will be described with reference to FIG. 6. Hereinafter, a structure different from the structure of the second embodiment will be mainly described.

In the second embodiment, the trench electrodes 37b are electrically connected to the emitter electrodes 43 at the longitudinal ends of the trenches 35 through the emitter leading electrode 50. In the present embodiment, the trench electrodes 37b are connected to a control electrode 56, which is different from the emitter electrode 43, at the longitudinal ends of the trenches 35.

Figure 6:
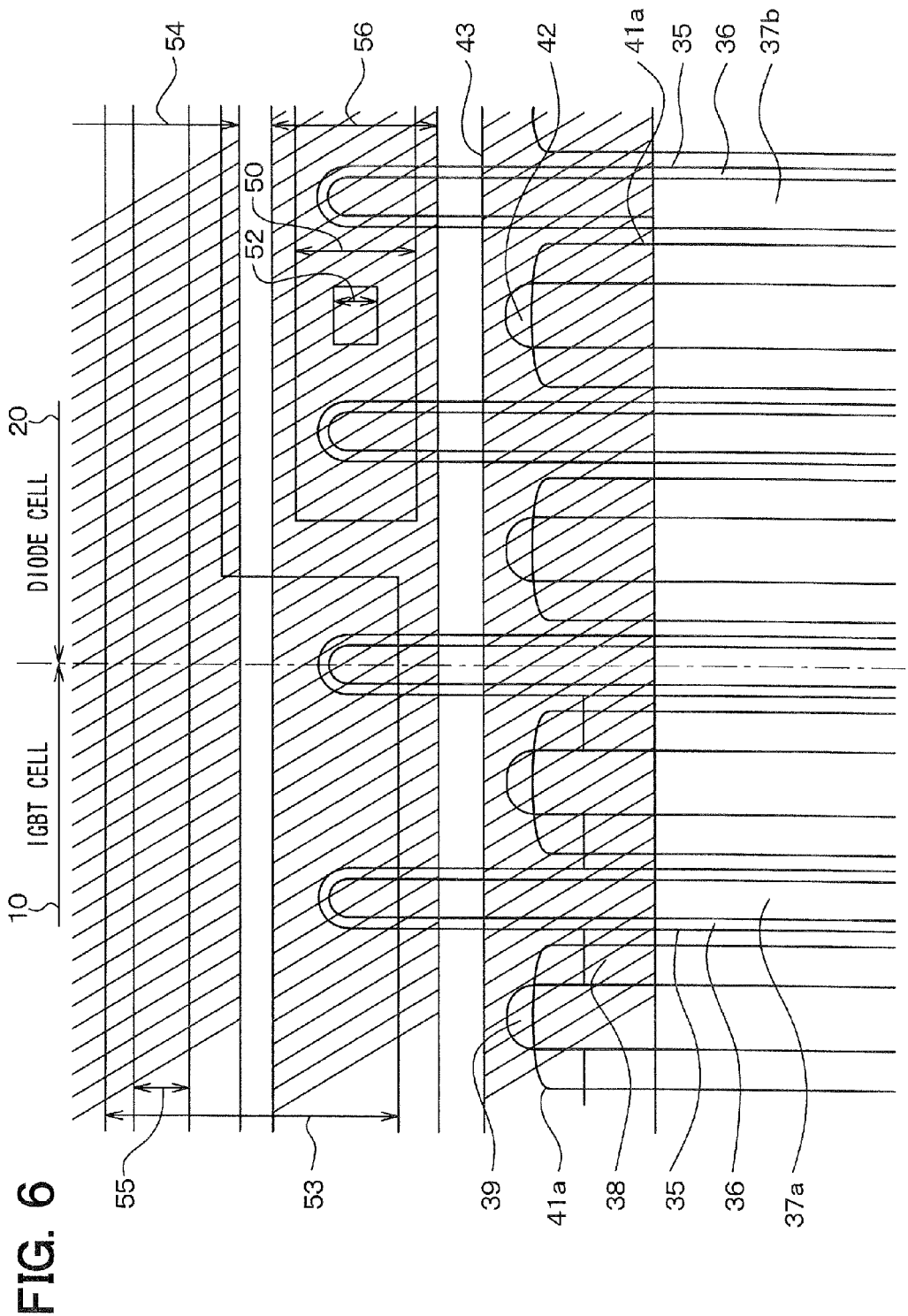
FIG. 6 is a plan view of a part of a semiconductor device according to a third embodiment of the present invention.

FIG. 6 is a plan view of a part of a semiconductor device according to the present embodiment. As shown in FIG. 6, the emitter leading electrode 50 and the gate leading electrode 53 are disposed in the similar layout to those of the second embodiment. Further, the control electrode 56 is disposed between the emitter electrode 43 and the gate metal electrode 54.

The control electrode 56 is separated from the emitter electrode 43 and the gate metal electrode 54. The emitter leading electrode 50 is electrically connected to the control electrode 56 through the contact hole 52.

In such a structure, a voltage different from the emitter potential can be independently applied to the trench electrodes 37b through the control electrode 56. Accordingly, it is possible to control the potential of the trench electrodes 37b of the diode cell 20.

Fourth Embodiment

A fourth embodiment will be described with reference to FIG. 7. Hereinafter, a structure different from the structures of the first through third embodiments will be mainly described.

In the present embodiment, the trench electrodes 37b of the diode cell 20 are electrically connected to the gate metal electrode 54.

Figure 7:
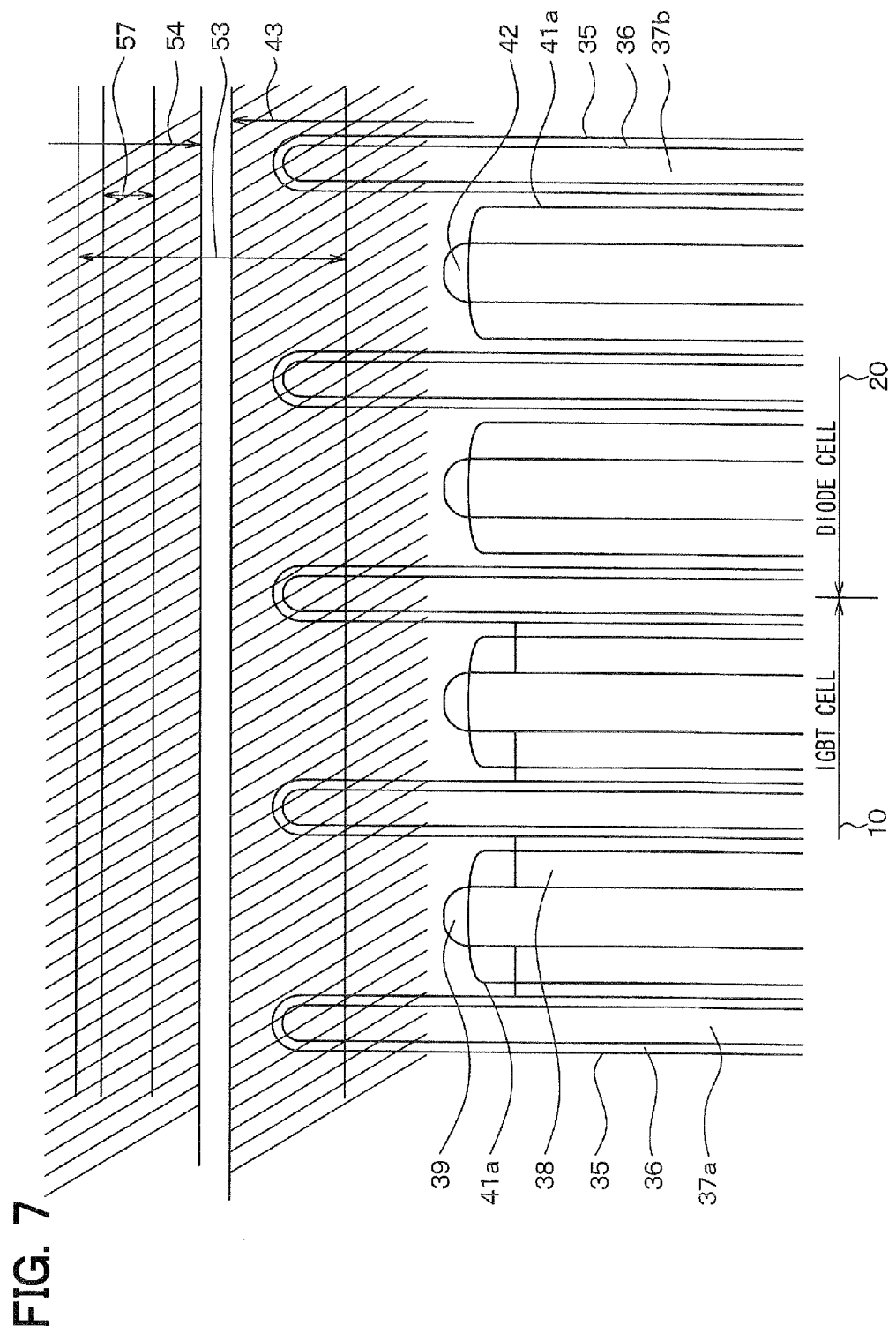
FIG. 7 is a plan view of a part of a semiconductor device according to a fourth embodiment of the present invention.

FIG. 7 is a plan view of a part of a semiconductor device according to the present embodiment. As shown in FIG. 7, the gate leading electrode 53 is formed to cover the longitudinal ends of the trenches 35 of the IGBT cell 10 and the diode cell 20. The gate leading electrode 53 is electrically connected to the gate metal electrode 54 through a contact hole 57.

In such a structure, the same voltage as the gate electrodes 37a of the IGBT cell 10 can be applied to the trench electrodes 37b of the diode cell 20.

Fifth Embodiment

A fifth embodiment will be described with reference to FIG. 8. Hereinafter, a structure different from the structures of the first through fourth embodiments will be mainly described.

Figure 8:
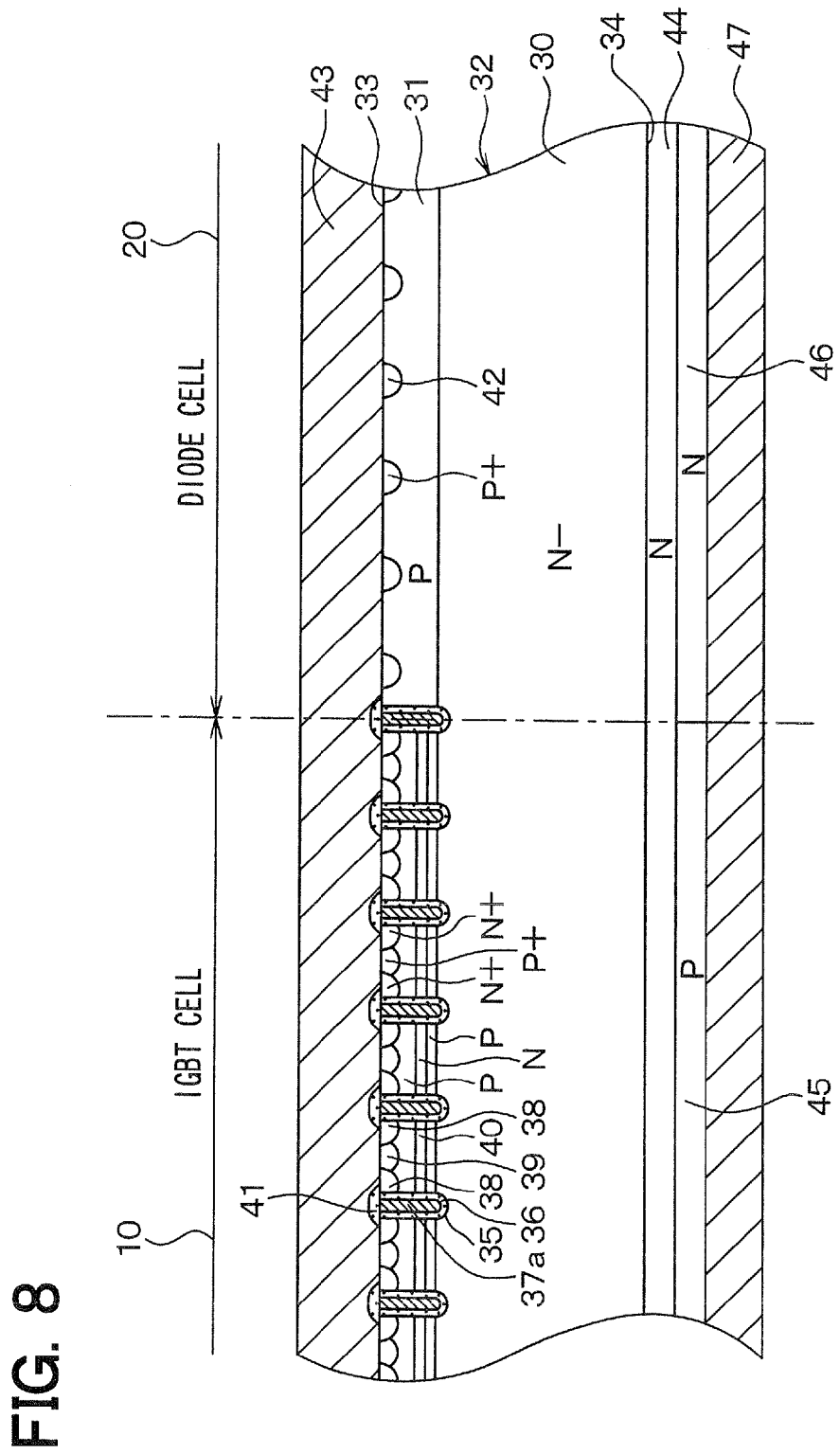
FIG. 8 is a cross-sectional view of a semiconductor device according to a fifth embodiment of the present invention.

FIG. 8 is a cross-sectional view of a part of a semiconductor device according to the present embodiment. As shown in FIG. 8, in the diode cell 20, the trenches 35, the gate insulating film 36 and the trench electrodes 37b are not formed, but the second contact regions 42 are formed at equal intervals. In this way, the diode cell 20 can be formed without having the trench electrodes 37b.

Sixth Embodiment

A sixth embodiment will be described with reference to FIG. 9. Hereinafter, a structure different from the structures of the first through fifth embodiment will be mainly described.

Figure 9:
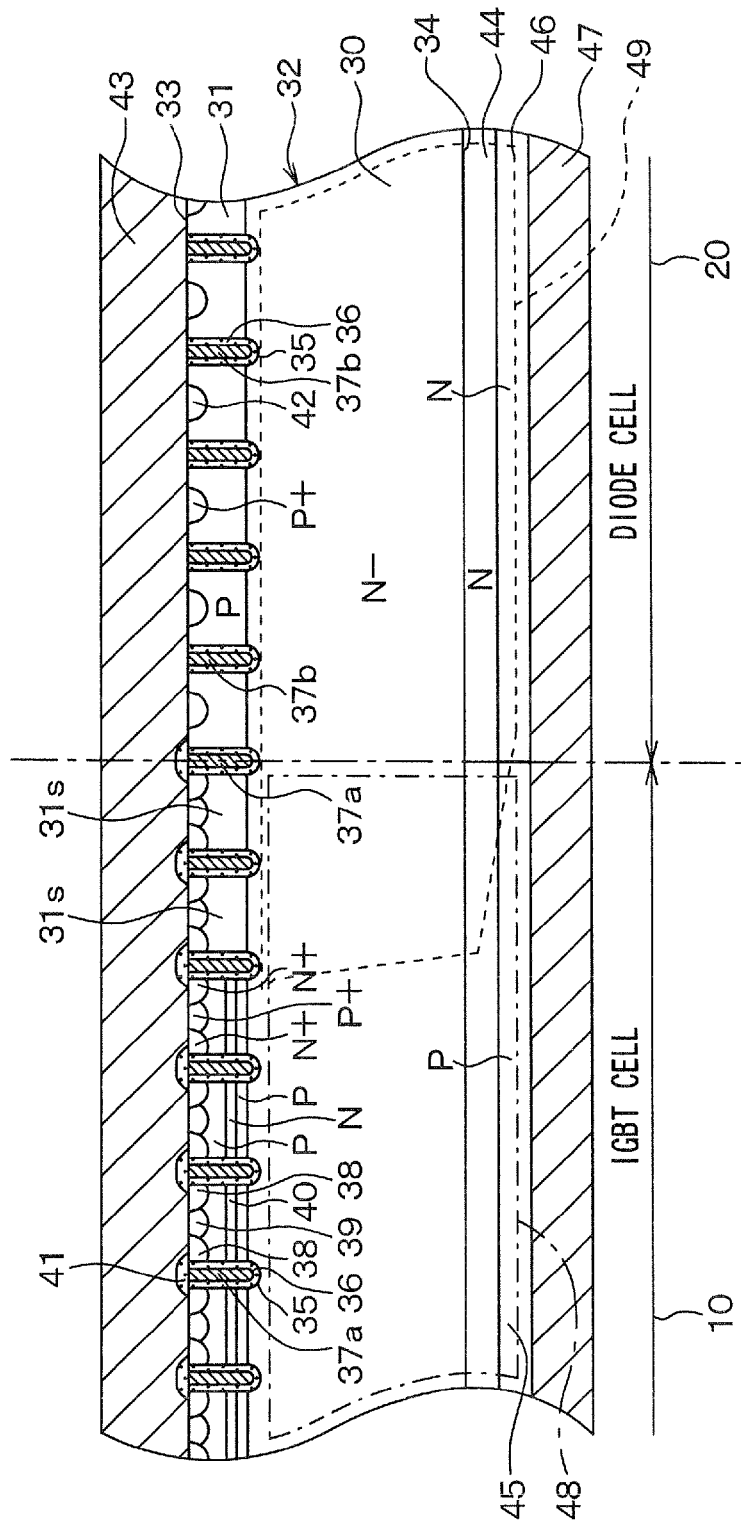
FIG. 9 is a cross-sectional view of a semiconductor device according to a sixth embodiment of the present invention.

FIG. 9 is a cross-sectional view of a part of a semiconductor device according to the present embodiment with illustration of the IGBT operation region 48 and the diode operation region 49. As shown in FIG. 9, the floating layer 40 is not formed in two sections 31s of the base layer 31 of the IGBT cell 10, the two sections 31s being at the outer portion of the IGBT cell 10 adjacent to the diode cell 20.

Here, the outer portion of the IGBT cell 10 adjacent to the diode cell 20 corresponds to a region including the sections 31s of the base layer 31 adjacent to the boundary between the collector layer 45 and the cathode layer 46.

In the sections 31s of the base layer 31 without having the floating layer 40, the emitter regions 38 and the first contact regions 39 serving as the IGBT element are formed.

Therefore, the sections 31s of the base layer 31 provide the channel region, and thus serve as the IGBT element. Since the sections 31s of the base layer 31 are not provided with the floating layer 40, the holes can be supplied toward the cathode layer 46 from the first contact regions 39. Therefore, the sections 31s also serve as the diode element. As such, the diode operation region 49 is expanded to a region where the floating layer 40 is not formed in the IGBT cell 10.

In this way, the diode operation region 49 overlaps the IGBT operation region 48. Therefore, the size of the diode cell 20 can be reduced by the overlapped region. Namely, the size of the semiconductor chip can be reduced.

Seventh Embodiment

A seventh embodiment will be described with reference to FIG. 10. Hereinafter, a structure different from the structures of the first through fifth embodiments will be mainly described.

Figure 10:
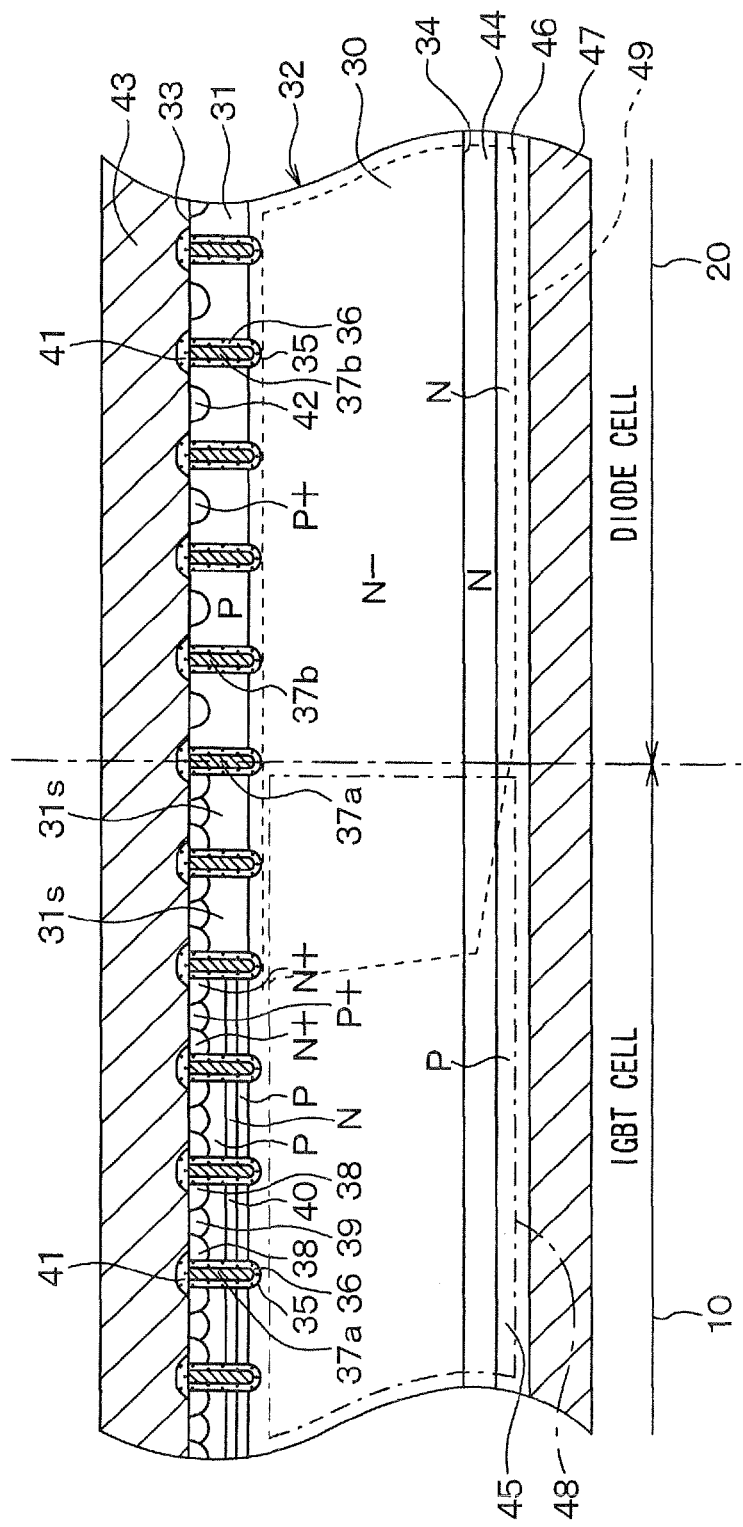
FIG. 10 is a cross-sectional view of a semiconductor device according to a seventh embodiment of the present invention.

FIG. 10 is a cross-sectional view of a part of a semiconductor device according to the present embodiment with illustration of the IGBT operation region 48 and the diode operation region 49. As shown in FIG. 10, the semiconductor device of the present embodiment is similar to that of the sixth embodiment, but the interlayer insulating film 41 is formed on the base layer 31 of the diode cell 20 to cover the upper ends of the trench electrodes 37b. As such, the trench electrodes 37b and the emitter electrode 43 are electrically insulated from each other by the interlayer insulating film 41.

In such a structure, for example, the trench electrodes 37b may be connected to the emitter electrode 43 through the emitter leading electrode 50, in the similar manner to the example shown in FIG. 4. As another example, the trench electrodes 37b may be connected to the control electrode 56 through the emitter leading electrode 50, in the similar manner to the example shown in FIG. 6. Furthermore, the trench electrodes 37b may be connected to the gate metal electrode 54 through the emitter leading electrode 50, in the similar manner to the example shown in FIG. 7.

Accordingly, in the case where the interlayer insulating film 41 is disposed to cover the trench electrodes 37b in the diode cell 20, the potential of the trench electrodes 37b can be suitably controlled.

Eighth Embodiment

An eighth embodiment will be described with reference to FIG. 8. Hereinafter, a structure different from the structures of the sixth and seventh embodiments will be mainly described.

Figure 11:
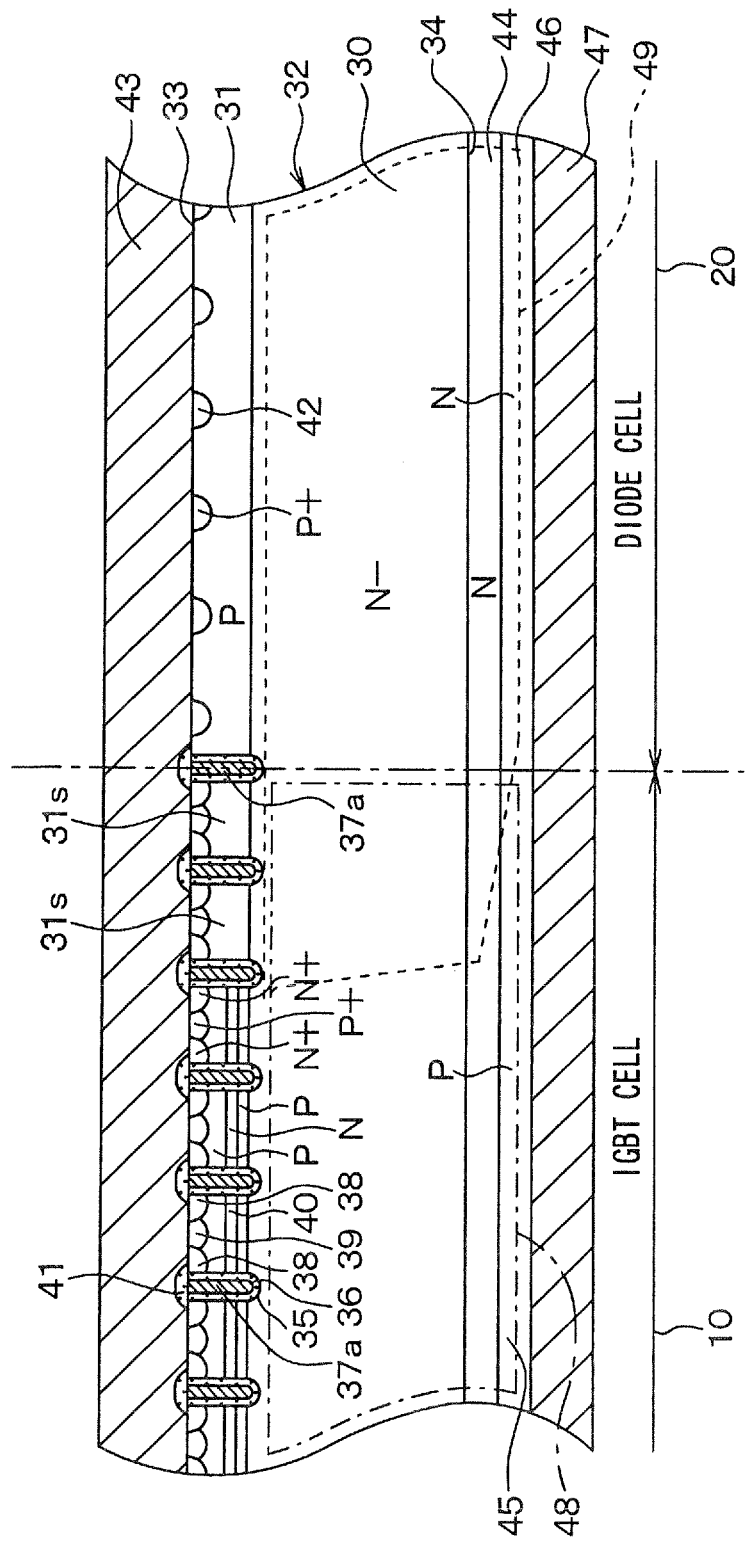
FIG. 11 is a cross-sectional view of a semiconductor device according to an eighth embodiment of the present invention.

FIG. 11 is a cross-sectional view of a part of a semiconductor device according to the present embodiment with illustration of the IGBT operation region 48 and the diode operation region 49. As shown in FIG. 11, the semiconductor device of the present embodiment is similar to the semiconductor device shown in FIG. 9, but the trenches 35, the gate insulating films 36 and the trench electrodes 37b are not formed in the diode cell 20.

Also in the case where the diode operation region 49 overlaps the IGBT operation region 48, the diode cell 20 can be configured without having the trench electrodes 37b.

Ninth Embodiment

A ninth embodiment will be described with reference to FIG. 12. Hereinafter, a structure different from the structures of the first through eighth embodiments will be mainly described.

Figure 12:
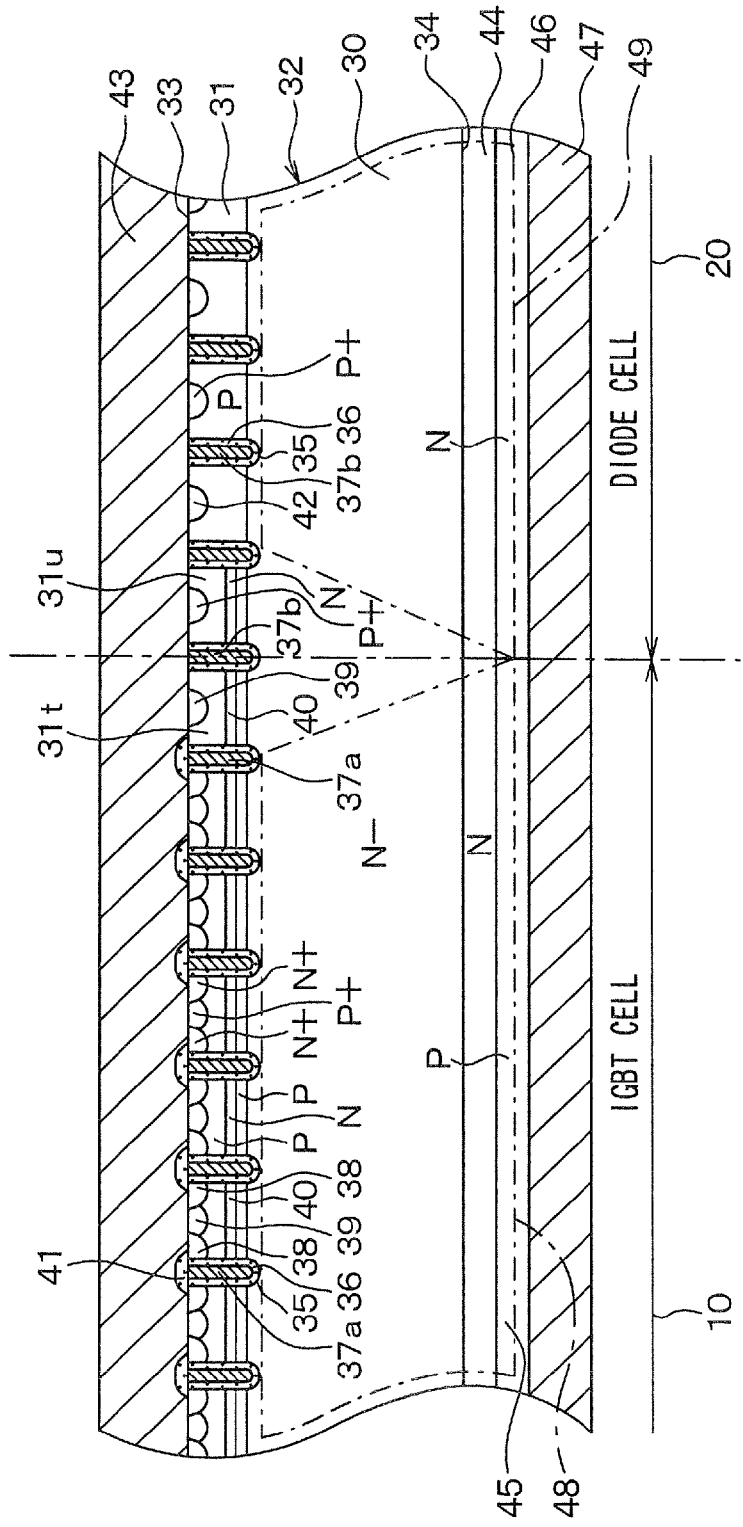
FIG. 12 is a cross-sectional view of a semiconductor device according to a ninth embodiment of the present invention.

FIG. 12 is a cross-sectional view of a part of a semiconductor device according to the present embodiment with illustration of the IGBT operation region 48 and the diode operation region 49.

As shown in FIG. 12, a section 31*t* of the base layer 31 disposed at the outer portion of the IGBT cell 10 adjacent to the diode cell 20 and a section 31*u* of the base layer 31 disposed at the outer portion of the diode cell 20 adjacent to the IGBT cell 10 are provided with the first contact region 39 and the floating layer 40, but are not provided with the emitter regions 38. It is to be noted that the sections 31*t*, 31*u* are provided with the second contact region 42, in place of the first contact region 39.

Here, the outer portion of the IGBT cell 10 adjacent to the diode cell 20 corresponds to a region including the section 31*t* of the base layer 31 that is located closest to the boundary between the collector layer 45 and the cathode layer 46 within the base layer 31. Likewise, the outer portion of the diode cell 20 adjacent to the IGBT cell 10 corresponds to a region including the section 31*u* of the base layer 31 that is located closest to the boundary between the collector layer 45 and the cathode layer 46 within the base layer 31.

In the present embodiment, the floating layer 40 and the first contact regions 39 are formed in the sections 31*t*, 31*u* of the base layer 31. However, the emitter regions 38 are not formed in the sections 31*t*, 31*u* of the base layer 31. The trench electrode 37*b* is formed in the boundary trench 35, which is located on the boundary line between the collector layer 45 and the cathode layer 46. However, the trench electrode 37*b* in the boundary trench 35 is electrically connected to the emitter electrode 43 without being covered with the interlayer insulating film 41.

In such a structure, the sections 31*t*, 31*u* of the base layer 31 do not serve as the IGBT element and the diode element. Therefore, the IGBT operation region 48 and the diode operation region 49 are formed in regions other than the sections 31*t*, 31*u*. In other words, in the present embodiment, the IGBT operation region 48 and the diode operation region 49 do not overlap each other.

Therefore, when the IGBT cell 10 is operated, the flow of holes from the drift layer 30 to the base layer 31 is restricted by the floating layer 40. As such, the conductivity modulation is enhanced, and hence the steady loss can be reduced. When the diode cell 20 is operated, excessive hole injection from the IGBT cell 10 is restricted. Therefore, the change in the forward voltage Vf in the diode cell 20 due to the gate interference can be restricted.

Tenth Embodiment

A tenth embodiment will be described with reference to FIG. 13. Hereinafter, a structure different from the structure of the ninth embodiment will be mainly described.

Figure 13:
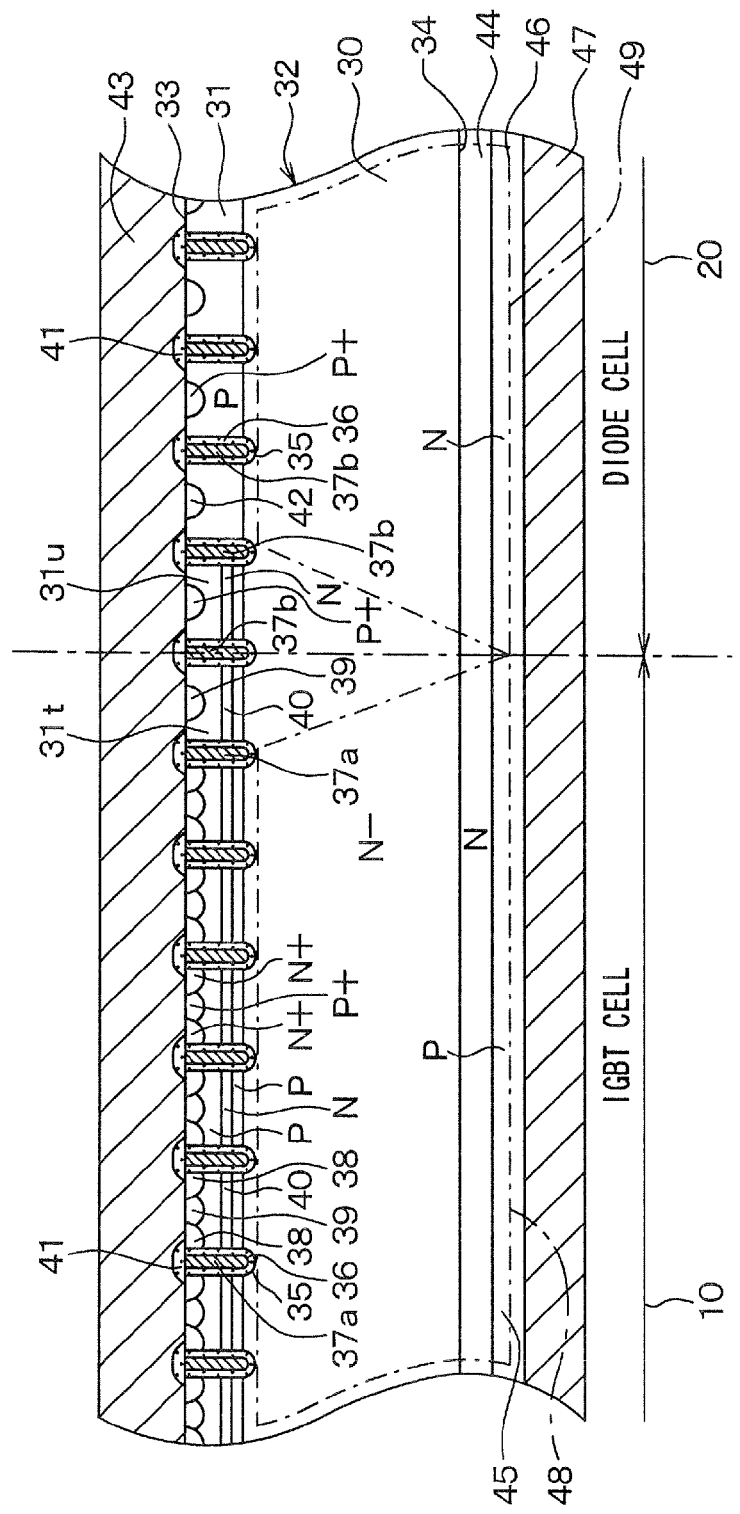
FIG. 13 is a cross-sectional view of a semiconductor device according to a tenth embodiment of the present invention.

FIG. 13 is a cross-sectional view of a part of a semiconductor device according to the present embodiment with illustration of the IGBT operation region 48 and the diode operation region 49. As shown in FIG. 13, the semiconductor device of the present embodiment has a structure similar to the semiconductor device of the ninth embodiment shown in FIG. 12, but the interlayer insulating film 41 is formed to cover the upper ends of the trench electrodes 37*b*. Thus, the trench electrodes 37*b* and the emitter electrode 43 are electrically insulated from each other by the interlayer insulating film 41.

In such a case, the trench electrodes 37*b* can be connected to one of the gate metal electrode 54, the emitter electrode 43, and the control electrode 56, through the emitter leading electrode 50, as described above.

Eleventh Embodiment

An eleventh embodiment will be described with reference to FIG. 14. Hereinafter, a structure different from the structure of the ninth embodiment will be mainly described.

Figure 14:
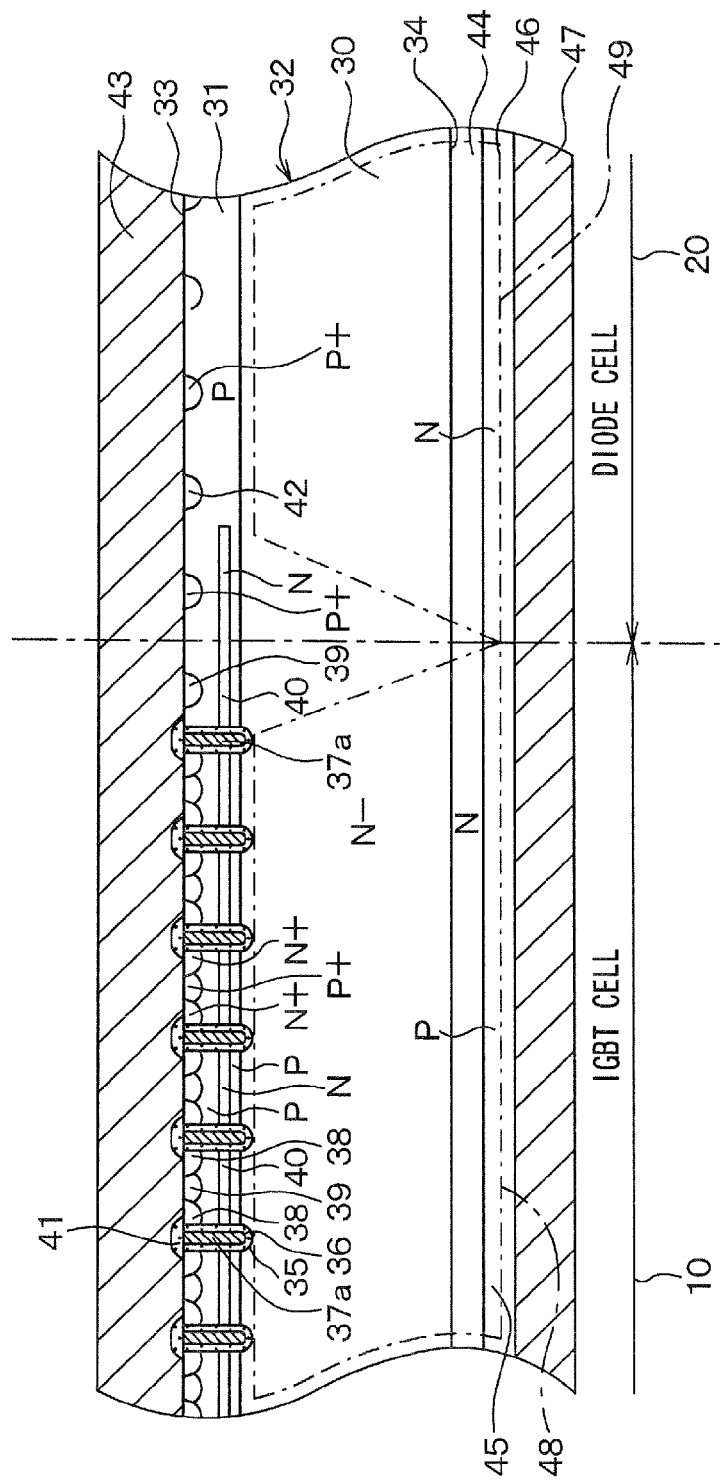
FIG. 14 is a cross-sectional view of a semiconductor device according to an eleventh embodiment of the present invention.

FIG. 14 is a cross-sectional view of a part of a semiconductor device according to the present embodiment with illustration of the IGBT operation region 48 and the diode operation region 49. As shown in FIG. 14, the semiconductor device of the present embodiment is similar to the semiconductor device of the ninth embodiment, but the trenches 35, the gate insulating films 36 and the trench electrodes 37*b* are not formed in the diode cell 20.

The floating layer 40 is formed to reach the diode cell 20 from the IGBT cell 10. That is, the floating layer 40 is formed beyond the boundary between the IGBT cell 10 and the diode cell 20, such as the boundary line between the collector layer 45 and the cathode layer 46. In such a structure, when the IGBT cell 10 is operated, the hole injection from the drift layer 30 to the base layer 31 can be restricted by the floating layer 40. Further, when the diode cell 20 is operated, excessive hole injection from the IGBT cell 10 can be restricted.

Also in the structure where the IGBT operation region 48 and the diode operation region 49 are fully separated from each other, the diode cell 20 can be configured without having the trench electrodes 37*b*.

Twelfth Embodiment

A twelfth embodiment will be described with reference to FIG. 15. Hereinafter, a structure different from the structure of the eleventh embodiment will be mainly described.

Figure 15:
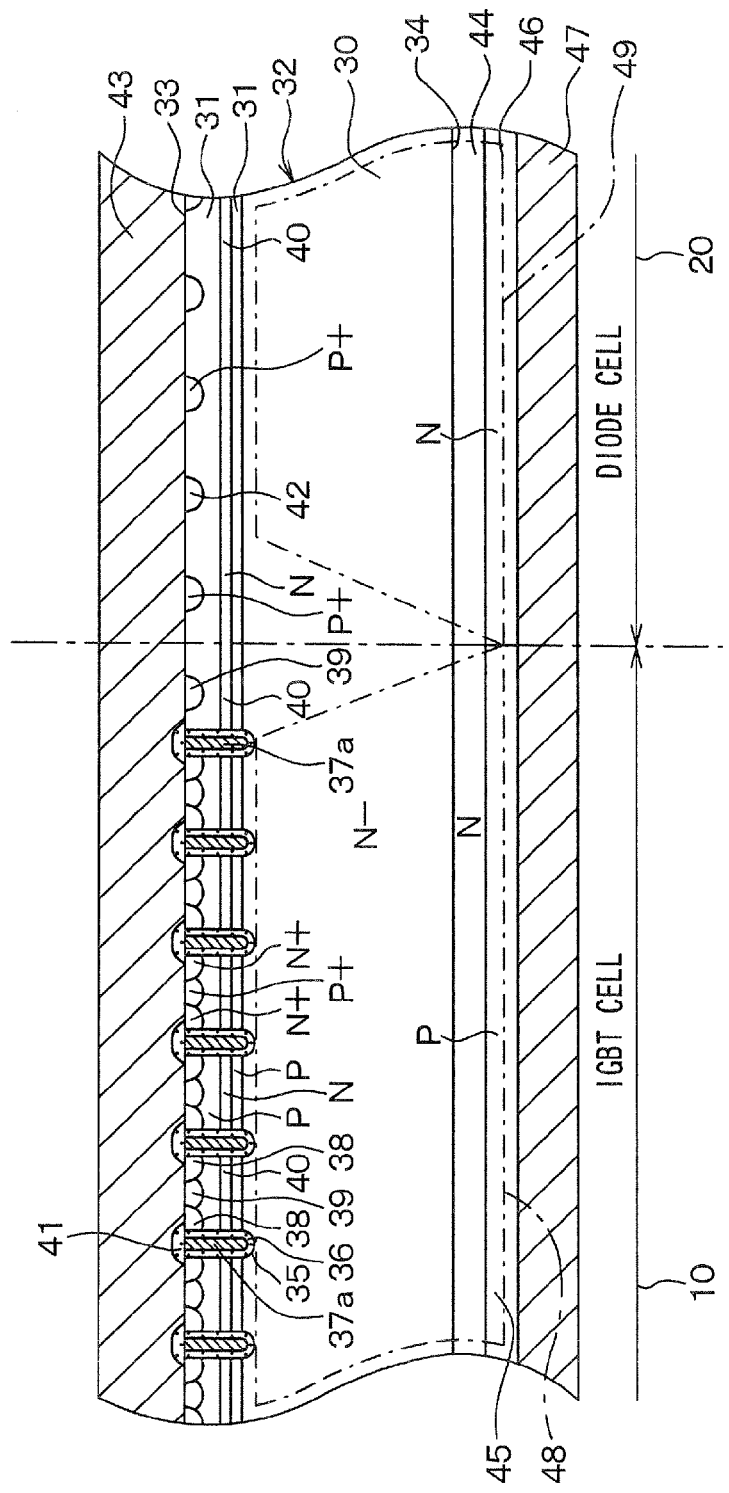
FIG. 15 is a cross-sectional view of a semiconductor device according to a twelfth embodiment of the present invention.

FIG. 15 is a cross-sectional view of a part of a semiconductor device according to the present embodiment with illustration of the IGBT operation region 48 and the diode operation region 49. As shown in FIG. 15, the floating layer 40 is formed entirely throughout the IGBT cell 10 and the diode cell 20.

In such a structure, when the IGBT cell 10 is operated, and when the diode cell 20 is operated, excessive hole injection to the drift layer 30 of the diode cell 20 from the IGBT cell 10 and the diode cell 20 can be restricted.

Thirteenth Embodiment

A thirteenth embodiment will be described with reference to FIG. 16. Hereinafter, a structure different from the structure of the ninth embodiment will be mainly described.

Figure 16:
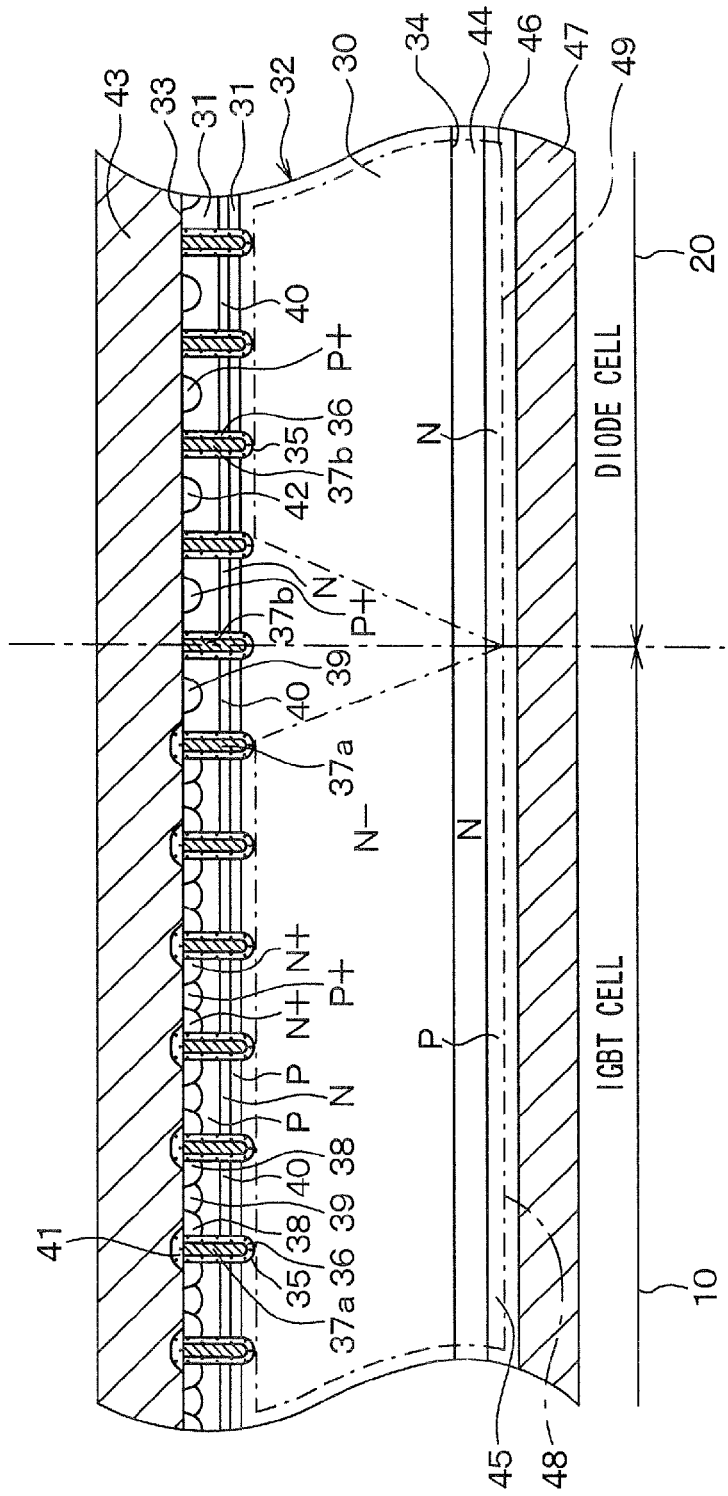
FIG. 16 is a cross-sectional view of a semiconductor device according to a thirteenth embodiment of the present invention.

FIG. 16 is a cross-sectional view of a part of a semiconductor device according to the present embodiment with illustration of the IGBT operation region 48 and the diode operation region 49. As shown in FIG. 16, the semiconductor device of the present embodiment has a similar structure to that of the semiconductor device of the ninth embodiment shown in FIG. 12, but the floating layer 40 is formed entirely throughout the IGBT cell 10 and the diode cell 20. Also in such a case, the similar advantageous effects to the twelfth embodiment can be achieved.

Fourteenth Embodiment

A fourteenth embodiment will be described with reference to FIG. 17 Hereinafter, a structure different from that of the thirteenth embodiment will be mainly described.

Figure 17:
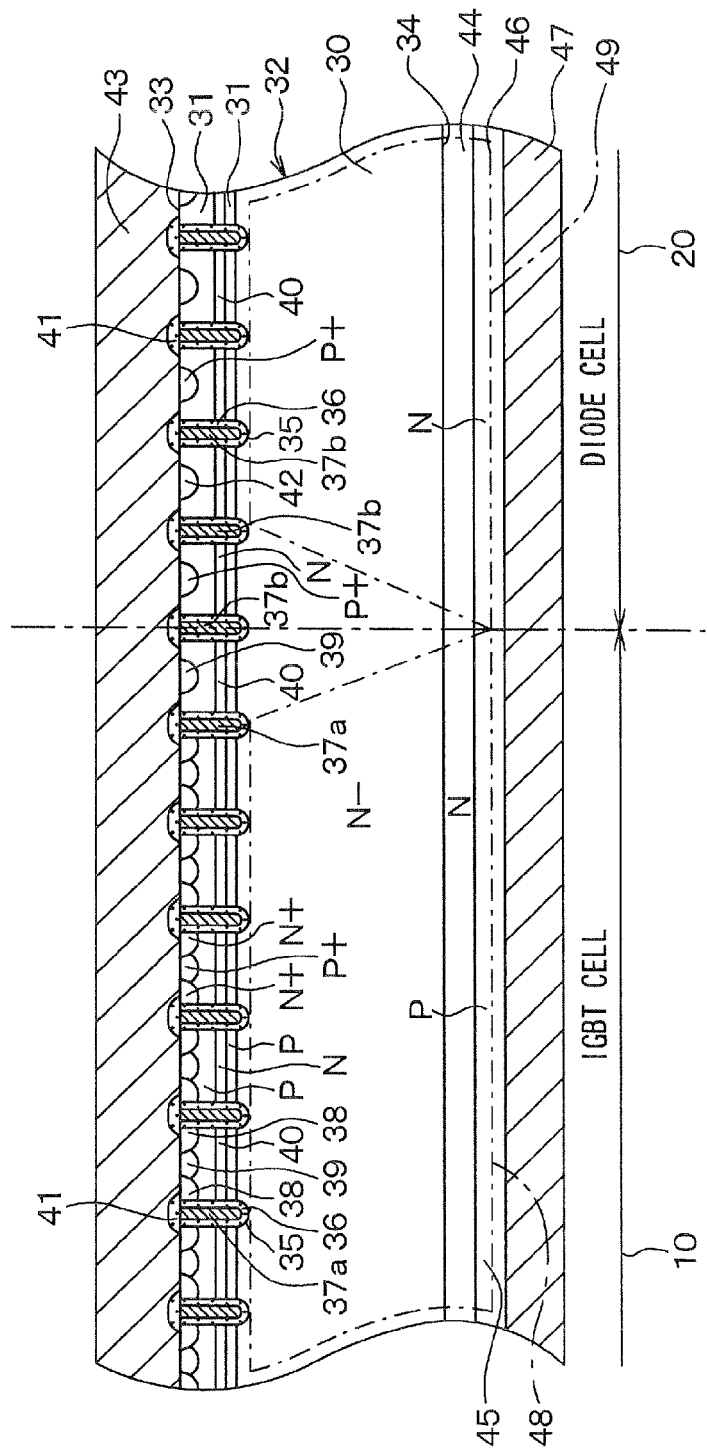
FIG. 17 is a cross-sectional view of a semiconductor device according to a fourteenth embodiment of the present invention.

FIG. 17 is a cross-sectional view of a part of a semiconductor device according to the present embodiment with illustration of the IGBT operation region 48 and the diode operation region 49. As shown in FIG. 17, the semiconductor device of the present embodiment has a similar structure as that of the semiconductor device of the thirteenth embodiment shown in FIG. 16, but the interlayer insulating film 41 is formed to cover the upper ends of the trench electrodes 37b. Thus, the trench electrodes 37b and the emitter electrode 43 are electrically insulated from each other by the interlayer insulating film 41.

In such a structure, therefore, the trench electrodes 37b can be connected to one of the emitter electrode 43, the control electrode 56 and the gate metal electrodes 54, through the emitter leading electrode 50, as described above. Also, similar to the twelfth embodiment, the hole injection to the drift layer 30 of the diode cell 20 from both the regions of the IGBT cell 10 and the diode cell 20 can be restricted.

Fifteenth Embodiment

A fifteenth embodiment will be described with reference to FIGS. 18A through 19B.

Figures 18A, 18B:
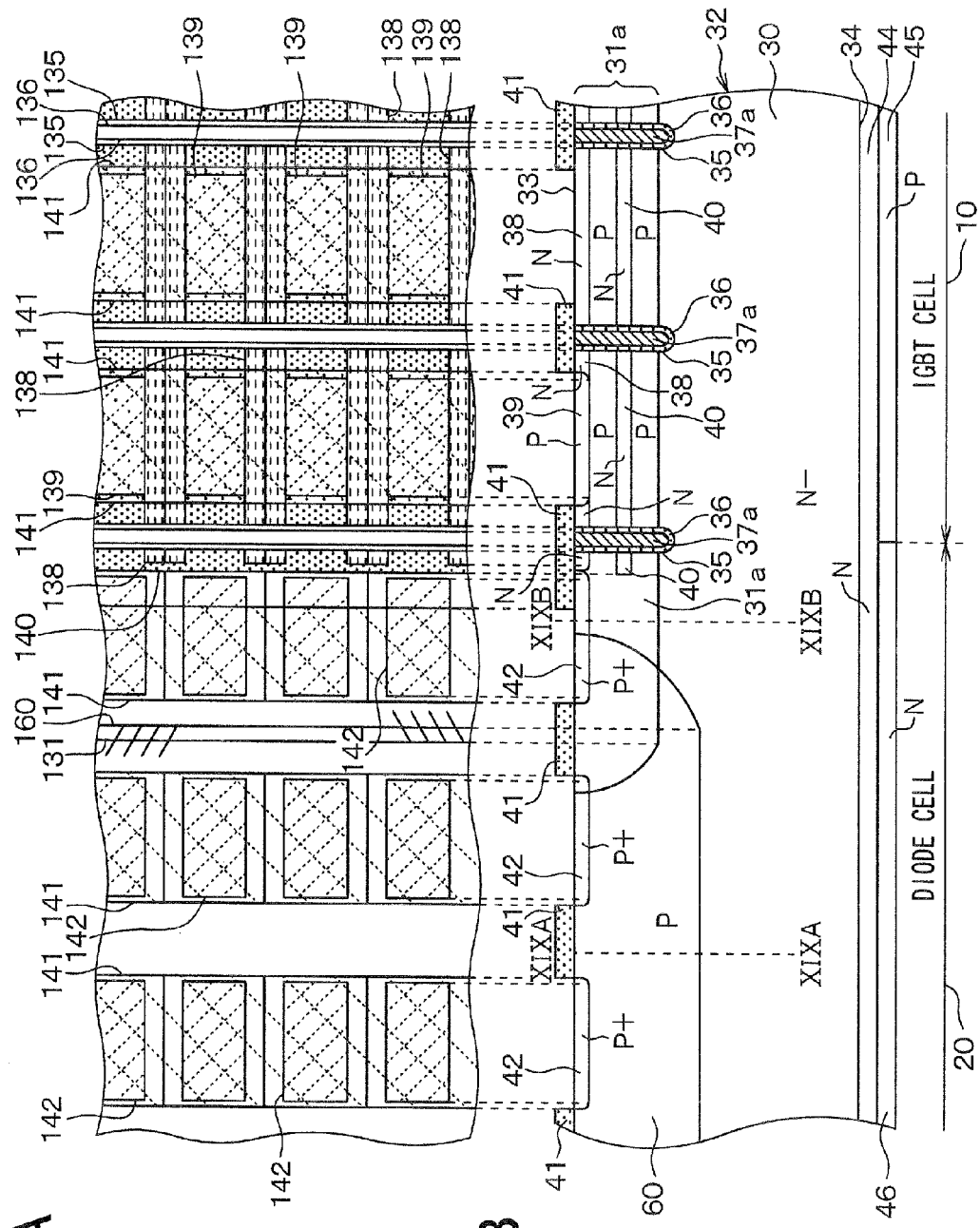
FIG. 18A is a plan view of masks used for manufacturing a semiconductor device according to a fifteenth embodiment of the present invention.
FIG. 18B is a cross-sectional view of the semiconductor device according to the fifteenth embodiment.

FIG. 18A is a plan view in which all masks used for manufacturing a semiconductor device according to the present embodiment are laid. FIG. 18B is a cross-sectional view of a part of the semiconductor device according to the present embodiment.

Similar to the aforementioned embodiments, the semiconductor device according to the present embodiment includes the IGBT cell 10 and the diode cell 20. The IGBT cell 10 and the diode cell 20 commonly have the semiconductor substrate 32 including the N$^-$-type drift layer 30. The N-type field stop layer 44 is disposed on the second surface 34 of the semiconductor substrate 32 in order to reduce on-voltage and switching loss.

The P-type collector layer 45 is disposed on the region of the field stop layer 44 corresponding to the IGBT cell 10 and the N-type cathode layer 46 is disposed on the region of he field stop layer 44 corresponding to the diode cell 20. The collector layer 45 and the cathode layer 46 are formed in the same level. Although not illustrated in FIG. 15, the collector electrode 47 is formed on the collector layer 45 and the cathode layer 46 in the similar manner to the example shown in FIG. 1.

A P-type channel layer 31a is formed in the surface portion of the drift layer 30 of the IGBT cell 10, similar to the base layer 31. Further, the trenches 35 are formed to pass through the channel layer 31a and reach the drift layer 30. In the present embodiment, a surface of the channel layer 31a opposite to the drift layer 30 provides the first surface 33 of the semiconductor substrate 32. A surface of the drift layer 30 opposite to the channel layer 31a provides the second surface 34 of the semiconductor substrate 32.

Each of the trenches 35 extends in the longitudinal direction of the first surface 33a of the semiconductor substrate 32. Here, the longitudinal direction corresponds to a direction perpendicular to an alignment direction of the IGBT cell 10 and the diode cell 20. That is, the longitudinal direction corresponds to a direction perpendicular to a paper surface of FIG. 18B. The longitudinal direction also corresponds to an up and down direction of FIG. 18A. The trenches 35 are disposed parallel to each other at equal intervals, for example.

The channel layer 31a is formed by an ion implantation technique using a mask 131 shown in FIG. 18A. The trenches 35 are formed by an etching technique using a mask 135 shown in FIG. 18A. In FIG. 18A, an opening(s) of each mask is suitably hatched for the purpose of clarity.

The gate insulating film 36 is formed to cover the inner surface of each trench 35. The gate insulating film 36 is formed by such as a thermal oxidizing technique or a CVD technique using a mask 136 shown in FIG. 18A. The gate electrode 37a, which is made of a polysilicon or the like, is disposed on the gate insulating film 36 of the trench 35 of the IGBT cell 10 to constitute the trench gate structure. The gate electrode 37a is connected to the pad for the gate.

In the IGBT cell 10, the channel layer 31a provides the channel region. In the present embodiment, the channel layer 31a is mainly formed in the IGBT cell 10. Further, the channel layer 31a is disposed beyond the boundary between the IGBT cell 10 and the diode cell 20 toward the IGBT cell 10. That is, the channel layer 31a is formed also in a part of the diode cell 20, the part being adjacent to the IGBT cell 10.

The N-type emitter regions 38 are formed in the surface portion of the channel layer 31a. The emitter regions 38 are disposed in the striped shape along the direction perpendicular to the longitudinal direction of the trenches 35, with respect to the direction along the first surface 33. The P$^+$-type first contact regions 39 are formed in the surface portion of the channel layer 31a, between the emitter regions 38.

The N-type emitter regions 38 have the impurity concentration higher than that of the N$^-$-type drift layer 30. The emitter regions 38 are ended within the channel layer 31a. Also, the emitter regions 38 are disposed along the side surfaces of the trenches 35 within the channel layer 31a.

Specifically, each emitter region 38 is formed in a bar shape extending in the longitudinal direction of the trench 35 and along the side surface of the trench 35, in an area between the trenches 35. The ends of the emitter region 38 are ended within the trench 35 with respect to the longitudinal direction of the trench 35. That is, the end of the emitter region 38 is shorter than the longitudinal end of the trench 35 with respect to the longitudinal direction of the trench 35. The emitter regions 38 are formed by an ion implantation technique using a mask 138 shown in FIG. 18A. Thus, the emitter regions 38 are disposed in the striped shape along the alignment direction of the IGBT cell 10 and the diode cell 20.

The P$^+$-type first contact regions 39 have the impurity concentration higher than that of the P$^+$-type channel layer 31a. Similar to the emitter regions 38, the first contact regions 39 are ended within the channel layer 31a. The first contact regions 39 are formed by an ion implantation technique using a mask 139 shown in FIG. 18A. Thus, the first contact regions 39 are disposed intermittently in the longitudinal direction of the trenches 35 (i.e., the emitter regions 38), between the adjacent emitter regions 38.

In the channel layer 31a of the IGBT cell 10, the N-type floating layer 40 is formed at a position deeper than the emitter regions 38 and the first contact regions 39 from the first surface 33. The floating layer 40 is disposed to separate the channel layer 31a in the depth direction of the trenches 35. Specifically, the floating layer 40 is disposed to separate the channel layer 31a into a first portion (e.g., upper portion in FIG. 18B) in which the emitter regions 38 and the firs contact regions 39 are formed and a second portion (e.g., lower portion in FIG. 18B) contacting the drift layer 30. The floating layer 40 is formed by an ion implantation technique using a mask 140 shown in FIG. 18A.

The interlayer insulating film 41 is formed on the channel layer 31a to cover the gate electrodes 37a. The interlayer insulating film 41 is formed by a CVD technique or the like using a mask 141 shown in FIG. 18A. Thus, the emitter regions 38 are partly exposed from the interlayer insulating film 41. Also, the first contact regions 39 are exposed from the interlayer insulating film 41. Further, as shown in FIG. 18B, the interlayer insulating film 41 fully covers the emitter region 38 that is located closest to the diode cell 20. Therefore, the emitter region 38 that is located closest to the diode cell 20 does not serve as the IGBT element.

In the diode cell 20, a P-type RESURF region 60 is formed in the surface portion of the drift layer 30. The RESURF region 60 is deeper (e.g., thicker) than the trenches 35. The RESURF region 60 serves as an anode. The RESURF region 60 is deeper than the trenches 35 at least at the boundary between the IGBT cell 10 and the diode cell 20.

The RESURF region 60 is formed by an ion implantation technique using a mask 160 shown in FIG. 18A. In the present embodiment, for example, the RESURF region 60 is deeper than the trenches 35 in the whole area of the diode cell 20.

As shown in FIG. 18B, the channel layer 31a of the IGBT cell 10 and the RESURF region 60 of the diode cell 20 overlap each other in the region of the diode cell 20 with respect to the direction perpendicular to the first surface 33 of the semiconductor substrate 32. Therefore, a depletion layer provided by the channel layer 31a and a depletion layer provided by the RESURF layer 60 are smoothly connected to each other.

The $P^+$-type second contact regions 42 are formed in the surface portion of the RESURF region 60, as shown in FIG. 18B. The second contact regions 42 are formed by an ion implantation technique using a mask 142 shown in FIG. 18B.

The mask 142 has openings that are arranged intermittently in the longitudinal direction of the trenches 35 and the emitter regions 38. Therefore, the second contact regions 42 are formed intermittently in the longitudinal direction of the trenches 35 and intermittently in the direction perpendicular to the longitudinal direction of the trenches 35.

Further, the interlayer insulating film 41 is formed such that the second contact regions 42 expose on the first surface 33 of the semiconductor substrate 32. The interlayer insulating film 41 is also formed in the diode cell 20 using the aforementioned mask 141. That is, the interlayer insulating film 41 is formed in the IGBT cell 10 and the diode cell 20 using the mask 141 at the same step.

For example, the impurity concentration of the second contact regions 42 is different from that of the first contact regions 39. That is, the second contact regions 42 have the impurity concentration optimum for the diode characteristic.

The RESURF region 60 has the area density smaller than that of the channel layer 31a of the IGBT cell 10. This feature will be described with reference to FIGS. 19A and 19B.

FIG. 19A is a profile taken along a line XIXA-XIXA in FIG. 18B, and FIG. 19B is a profile taken along a line XIXB-XIXB in FIG. 18B. In FIGS. 19A and 19B, the horizontal axis represents a depth from the first surface 33 toward the second surface 34 of the semiconductor substrate 32, and the vertical axis represents the impurity concentration.

As shown in FIG. 19A, the RESURF region 60 (i.e., RESURF P) is deeper than the trench 35. As shown in FIG. 19B, the channel layer 31a (i.e., channel P) is shallower than the trench 35.

Further, as shown in FIGS. 19A and 19B, the impurity concentration of the RESURF region 60 is lower than that of the channel layer 31a. Therefore, the area density of the RESURF region 60 is smaller than that of the channel layer 31a. Here, the area density of the RESURF region 60 is obtained by integrating the region of the RESURF region 60 shown in FIG. 19A. Likewise, the area density of the channel layer 31a is obtained by integrating the region of the channel layer 31a shown in FIG. 19B.

Although not illustrated in FIG. 18B, the emitter electrode 43 is disposed on the first surface 33 of the semiconductor substrate, in the similar manner to the emitter electrode 43 shown in FIG. 1. For example, the emitter electrode is formed on the emitter regions 38, the first contact regions 39 and the second contact regions 42, which are exposed from the interlayer insulating film 41, to electrically connect with the emitter regions 38, the first contact regions 39 and the second contact regions 39.

In the aforementioned insulated gate semiconductor device, the region including the collector layer 45 serves as the IGBT element, and the region including the cathode layer 46 serves as the diode element.

In the present embodiment, the semiconductor device is provided with the RESURF region 60 as the anode that is deeper than the trenches 35 and has the area density lower than that of the channel layer 31a.

In such a structure, at a location adjacent to the boundary between the IGBT cell 10 and the diode cell 20, the depletion layer formed in the drift layer 30 by the channel layer 31a and the depletion layer formed in the drift layer 30 by the RESURF layer 60 can be smoothly connected to each other. Therefore, at the location adjacent to the boundary between the IGBT cell 10 and the diode cell 20, the field intensity in the drift layer 30 becomes smooth, and hence the field concentration can be reduced. As such, the withstand voltage of the semiconductor device can be ensured.

In the present embodiment, the semiconductor device has the floating layer 40 in the channel layer 31a of the IGBT cell 10. Therefore, similar to the first embodiment, the floating layer 40 serves as the potential wall. When the IGBT cell 10 is operated, the flow of holes from the drift layer 30 to the channel layer 31a can be restricted. As such, it is less likely that the holes will be discharged to the emitter electrode 43. As a result, the hole concentration and electron concentration of the drift layer 30 are increased, and hence the conductivity modulation is enhanced. Accordingly, since the resistance of the drift layer 30 is reduced, the steady loss of the IGBT cell 10 is reduced.

When the diode cell 20 is operated, the flow of holes from the first contact regions 39 of the IGBT cell 10 toward the diode cell 20 is blocked by the floating layer 40. As such, the excessive hole injection from the IGBT cell 10 to the diode cell 20 is restricted. As a result, the change in the forward voltage Vf of the diode cell 20 due to the gate interference of the IGBT cell 10 is restricted.

Sixteenth Embodiment

Figure 20:
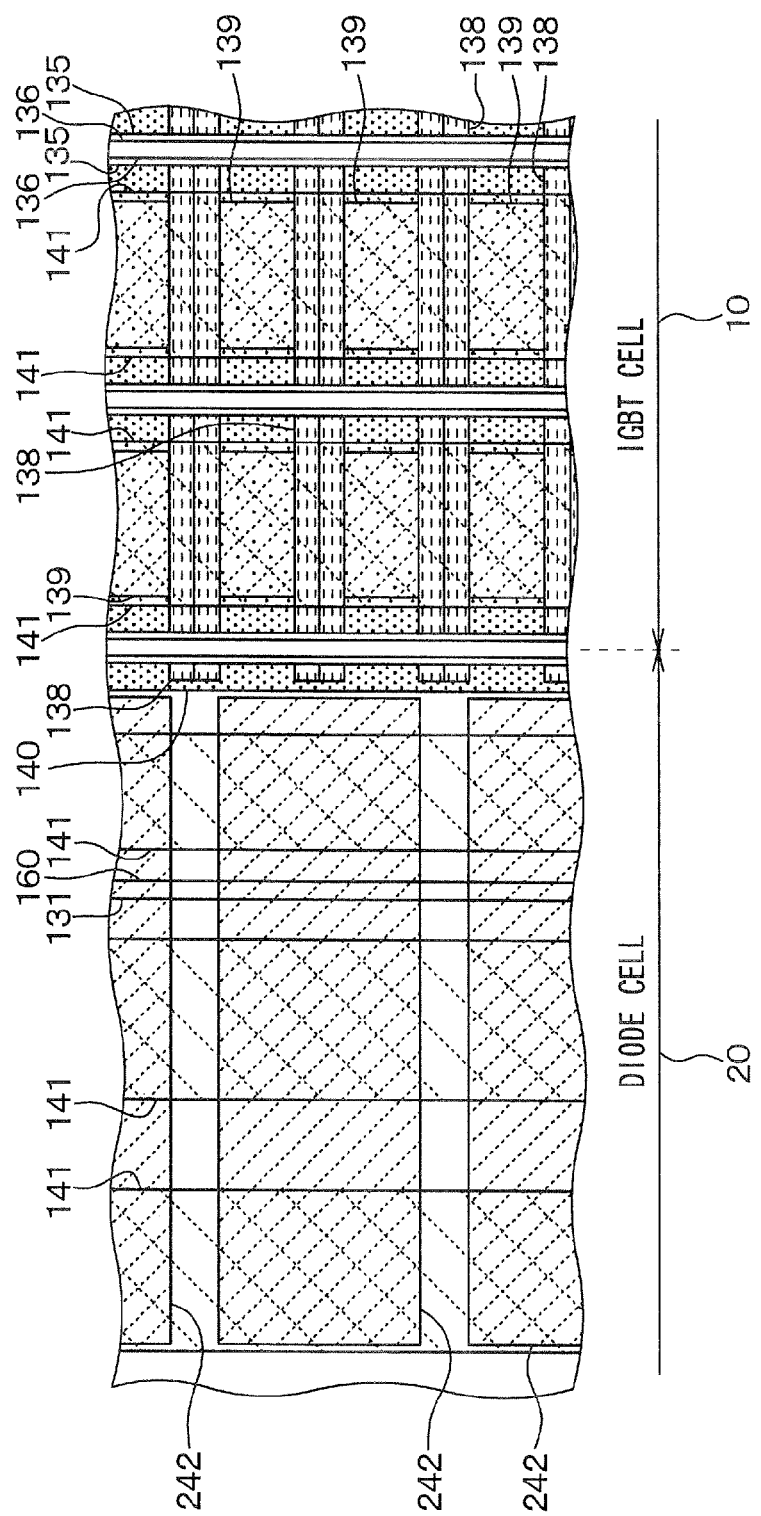
FIG. 20 is a plan view of masks used for manufacturing a semiconductor device according to a sixteenth embodiment of the present invention.

A sixteenth embodiment will be described with reference to FIG. 20. Hereinafter, a structure different from the structure of the fifteenth embodiment will be mainly described. FIG. 20 is a plan view in which all the masks used for manufacturing the semiconductor device according to the present embodiment are laid.

As shown in FIG. 20, the second contact regions 42 are formed by using a mask 242. The mask 242 has stripe shaped openings in the alignment direction of the IGBT cell 10 and the diode cell 20. Thus, the second contact regions 42 are arranged in the striped shape in the direction perpendicular to the longitudinal direction of the trenches 35.

The openings of the mask 242 are larger than the openings of the mask 142 used in the fifteenth embodiment. Therefore, in the present embodiment, the area of the second contact regions 42 is larger than that of the second contact regions 42 of the fifteenth embodiment. As such, the hole injection to the drift layer 30 increases. However, such a structure is effective when the hole injection needs to be increased in the structure of the fifteenth embodiment.

Seventeenth Embodiment

Figure 21:
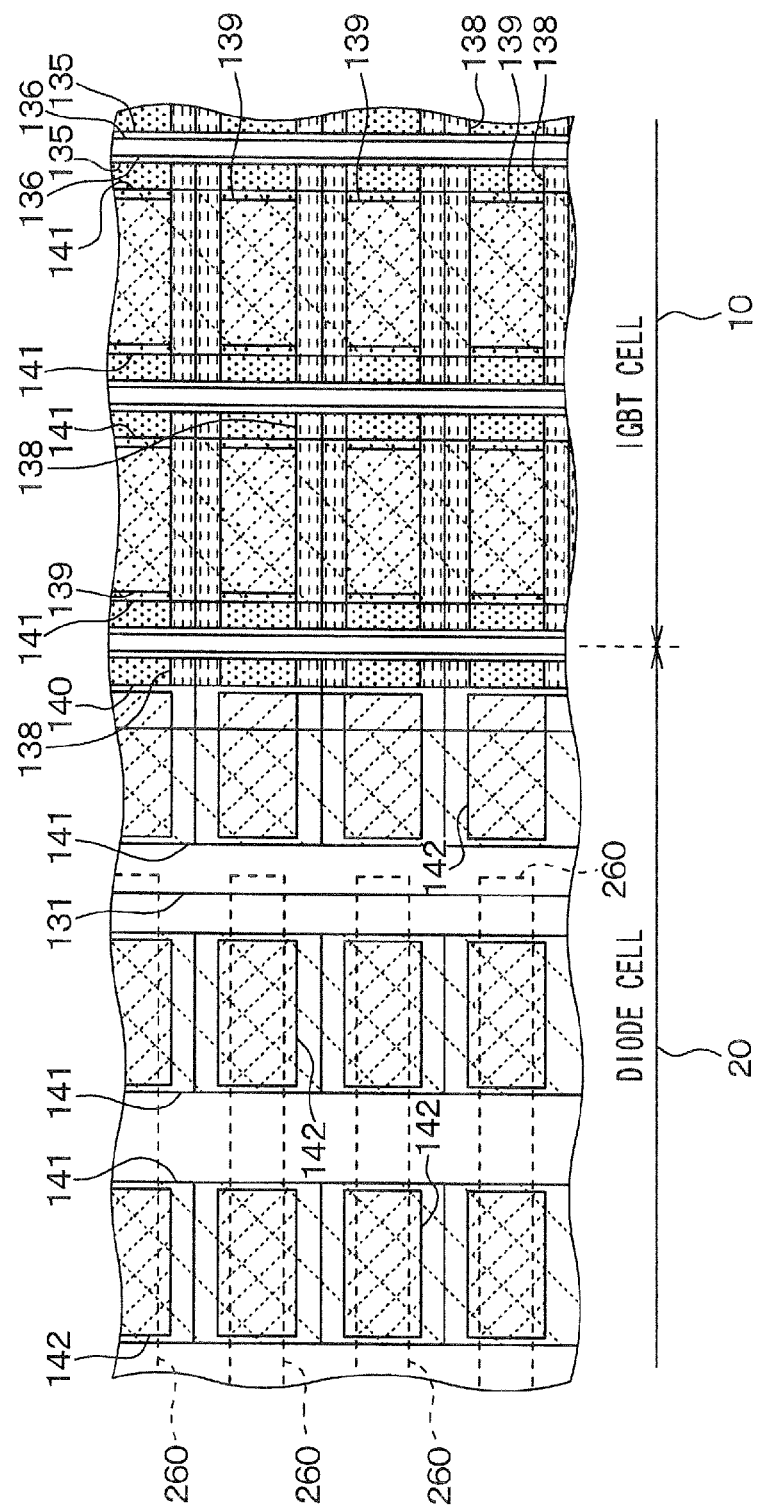
FIG. 21 is a plan view of masks used for manufacturing a semiconductor device according to a seventeenth embodiment of the present invention.

A seventeenth embodiment will be described with reference to FIG. 21. Hereinafter, a structure different from the structure of the fifteenth embodiment will be mainly described. FIG. 21 is a plan view in which all the masks used for manufacturing the semiconductor device according to the present embodiment are laid.

As shown in FIG. 21, a mask 260 for forming the RESURF region 60 has stripe-shaped openings along the alignment direction of the IGBT cell 10 and the diode cell 20. That is, the rate of openings in the mask 260 is modified from that of the mask 160 used in the fifteenth embodiment. The RESURF region 60 can be formed by using the mask 260.

In this case, the RESURF region 60 is formed in the striped shape along the direction perpendicular to the longitudinal direction of the trenches 35. Alternatively, the mask 260 may have mesh-shaped openings.

Eighteenth Embodiment

An eighteenth embodiment will be described with reference to FIG. 22.

Hereinafter, a structure different from the structures of the fifteenth through seventeenth embodiments will be mainly described. FIG. 22 is a plan view in which all the masks used for manufacturing the semiconductor device according to the present embodiment are laid.

Figure 22:
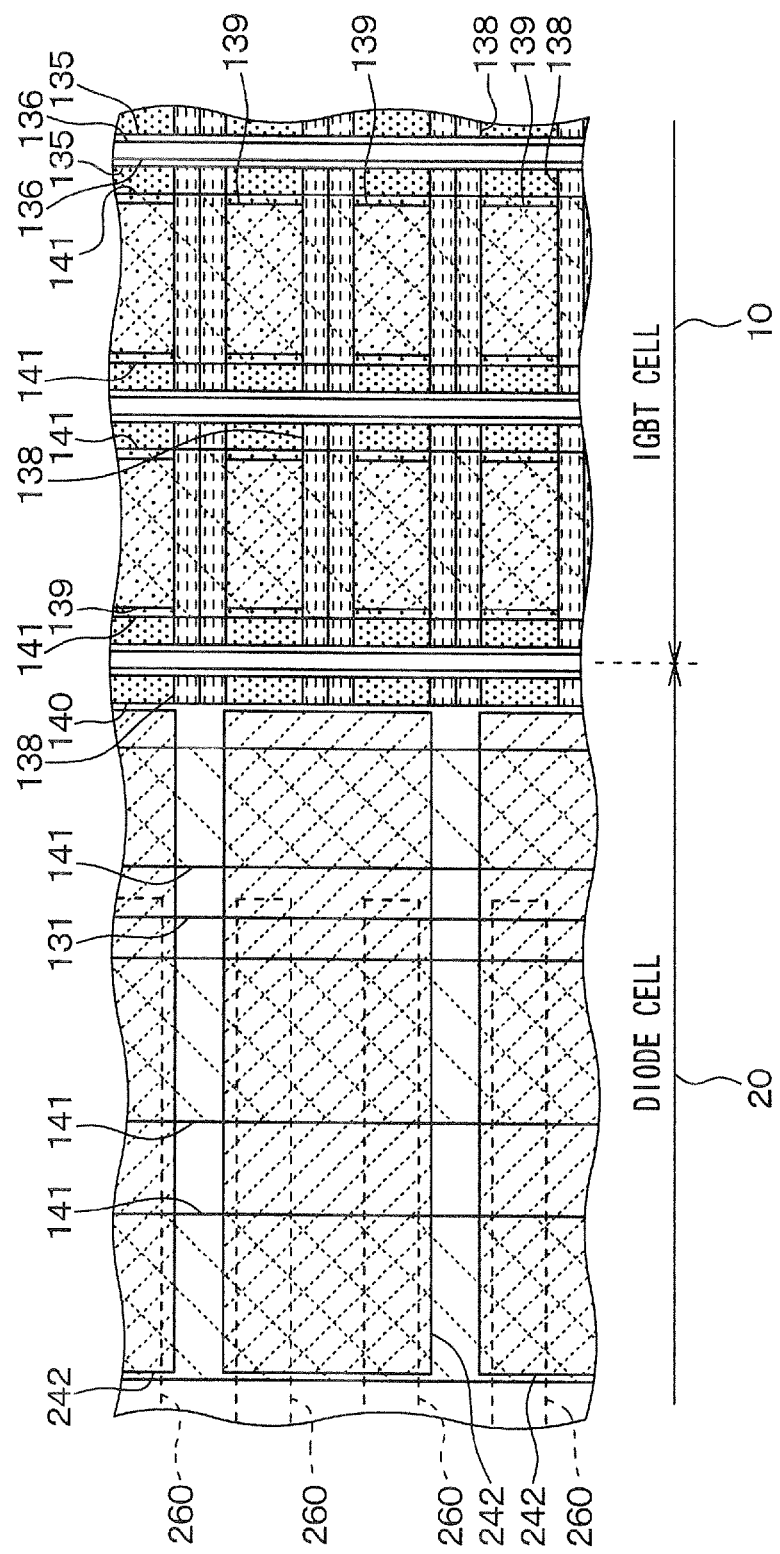
FIG. 22 is a plan view of masks used for manufacturing a semiconductor device according to an eighteenth embodiment of the present invention.

In the present embodiment, as shown in FIG. 22, the RESURF region 60 is formed by using the mask 260 of the seventeenth embodiment shown in FIG. 21, and the second contact regions 42 are formed by using the mask 242 of the sixteenth embodiment shown in FIG. 20. In this case, the RESURF region 60 is formed in the striped shape along the direction perpendicular to the longitudinal direction of the trenches 35. Also, the second contact regions 42 are formed in the striped shape along the RESURF region 60. Further, second contact region 42 covers the predetermined number of stripe portions of the RESURF region 60 with respect to the direction perpendicular to the first surface 33 of the semiconductor substrate 32. For example, each second contact region 42 covers the two stripe portions of the RESURF region 60.

As described above, both of the RESURF regions 60 and the second contact regions 42 can be formed into the striped shape.

Nineteenth Embodiment

A nineteenth embodiment will be described with reference to FIGS. 23, 24A through 24C. Hereinafter, a structure different from the structures of the fifteenth through eighteenth embodiments will be mainly described.

Figure 23:
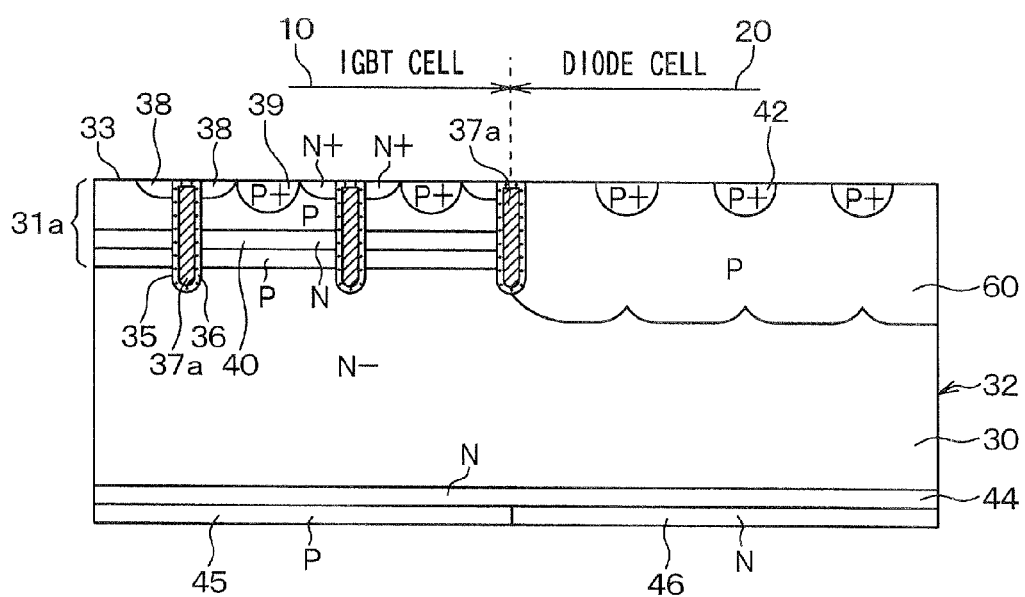
FIG. 23 is a cross-sectional view of a semiconductor device according to a nineteenth embodiment of the present invention.

FIG. 23 is a cross-sectional view of a part of a semiconductor device according to the present embodiment. As shown in FIG. 23, one of the multiple trenches 35 (hereinafter, boundary trench) is formed on the boundary line between the collector layer 45 and the cathode layer 46. The boundary trench 35 defines the boundary between the IGBT cell 10 and the diode cell 20. The gate electrode 37a is disposed in the boundary trench 35.

At the boundary between the IGBT cell 10 and the diode cell 20, the RESURF region 60 is formed to connect to the bottom of the boundary trench 35. That is, in the present embodiment, the channel layer 31a and the RESURF region 60 do not overlap with each other in the direction perpendicular to the surface 33 of the semiconductor substrate 32. Further, the second contact regions 42 are intermittently formed on the surface portion of the RESURF region 60, similar to the fifteenth embodiment.

The RESURF region 60 is formed simultaneously in an ion implantation step of forming a withstand voltage structure (RESURF) at the outer portion of the semiconductor substrate 32.

Figure 24A:
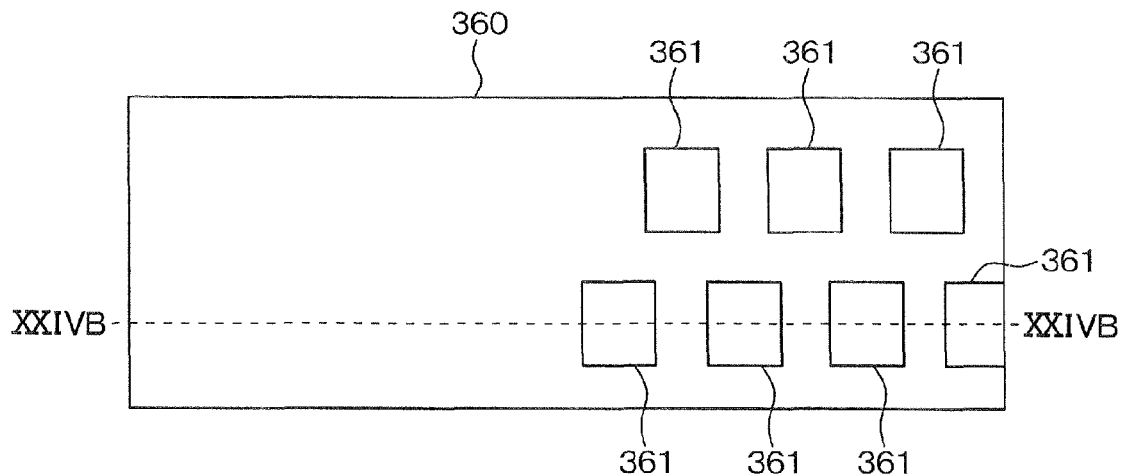
FIG. 24A is a plan view of a mask used for forming a RESURF region of the semiconductor device according to the nineteenth embodiment.
Figure 24B:
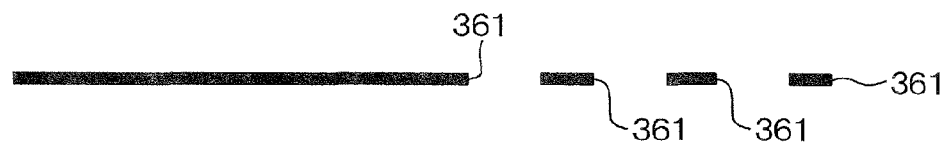
FIG. 24B is a sectional view of the mask taken along a line XXIVB-XXIVB in FIG. 24A.

In such a case, a mask 360 shown in FIG. 24A is used. As shown in FIG. 24B, the mask 360 has multiple openings 361 at locations corresponding to the diode cell 20. The openings 361 are, for example, arranged in staggered rows. By adjusting the opening rate of the openings 361 of the mask 360, a junction depth and the impurity concentration of the RESURF region 60 can be controlled.

Figure 24C:
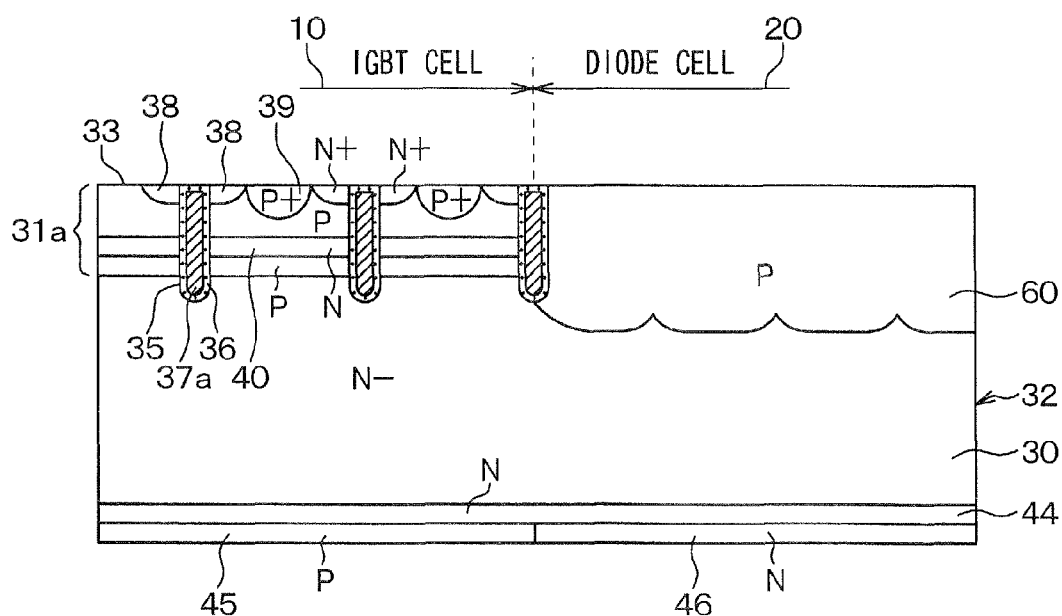
FIG. 24C is a cross-sectional view of the semiconductor device manufactured by using the mask shown in FIG. 24A.

By performing the ion implantation using the mask 360, the depth of the RESURF region 60 becomes smaller at locations corresponding to where the openings 361 are not formed than the locations corresponding to the openings 361, as shown in FIG. 24C. Further, the impurity concentration is reduced at the portions having the smaller depth. Therefore, another mask having openings at locations different from the openings 361 of the mask 360 is prepared, and the ion implantation is performed using the another mask. In such a case, in the step of forming the second contact region 42, the portions having the lower impurity concentration can be complemented.

If the impurity concentration is partially reduced, a latch-up phenomenon occurs, resulting in the decrease in the withstand voltage. To reduce the latch-up phenomenon, the second contact regions 42 are formed to complement the impurity concentration. In this way, the diode cell 20 shown in FIG. 23 is formed.

As described above, it is not always necessary that the RESURF region 60 overlap the channel layer 31a. In the case where the RESURF region 60 is formed in the same step as forming the outer peripheral voltage withstand portion, the impurity concentration of the portions without corresponding to the openings 361 can be complemented in the step of forming the second contact regions 42.

Twentieth Embodiment

A twentieth embodiment will be described with reference to FIG. 25. Hereinafter, a structure different from the structure of the nineteenth embodiment will be mainly described.

Figure 25:
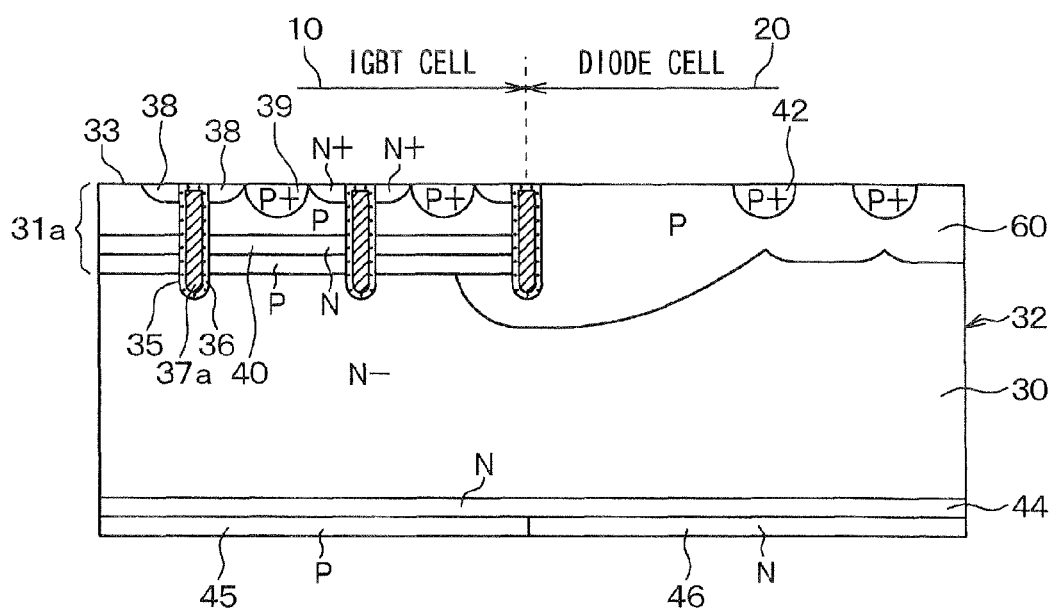
FIG. 25 is a cross-sectional view of a semiconductor device according to a twentieth embodiment of the present invention.

FIG. 25 is a cross-sectional view of a semiconductor device according to the present embodiment. As shown in FIG. 25, the RESURF region 60 overlaps the channel layer 31a in the IGBT cell 10 with respect to the direction perpendicular to the first surface 33 of the semiconductor substrate 32.

Such a structure is formed by using the mask 360 in which the openings 361 are arranged such that the rate of the openings is high at the location adjacent to the boundary between the IGBT cell 10 and the diode cell 20 and is gradually reduced toward the diode cell 20 as a function of distance from the boundary. Therefore, as shown in FIG. 25, the junction depth of the RESURF region 60 at the location adjacent to the boundary is greater than that of the channel layer 31a of the IGBT cell 10. Further, the junction depth of the RESURF region 60 reduces as the function of distance from the boundary.

As such, at the location adjacent to the boundary, the depletion layers are connected smoothly, and thus the field concentration and the current concentration are reduced. Accordingly, the capacity of the semiconductor device improves.

The collector layer 45 and the cathode layer 46 are formed such that the boundary between the collector layer 45 and the cathode layer 46 is located exactly under the deepest portion of the RESURF region 60.

In this way, the RESURF region 60 can be formed to overlap the channel layer 31a in the IGBT cell 10.

Other Embodiments

Various exemplary embodiments of the present invention are described hereinabove. However, the present invention is not limited to the above-described exemplary embodiments, but may be implemented in various other ways without departing from the spirit of the invention. Further, the present invention may be implemented by combining the above-described exemplary embodiments in various other ways.

For example, the position of the boundary between the collector layer 45 and the cathode layer 46 can be suitably modified. Also, the range of the floating layer 40 in the base layer 31 and the channel layer 31a can be suitably modified. Further, the range where the emitter regions 38 are formed can be suitably modified. Moreover, the position where the gate electrode 37a serves as the IGBT element can be suitably modified.

In some of the aforementioned embodiments, the interlayer insulating film 41 is fully removed in the diode cell 20. Alternatively, the interlayer insulating film 41 may remain in the diode cell 20. Further, the field stop layer 44 is not always necessary. The semiconductor substrate 32 may have other layers, in addition to the drift layer 30 and the base layer 31 or the channel layer 31a. The aforementioned conductivity-types of the components, such as N-type or P-type may be reversed.

Additional advantages and modifications will readily occur to those skilled in the art. The invention in its broader term is therefore not limited to the specific details, representative apparatus, and illustrative examples shown and described.

What is claimed is:
1. A semiconductor device comprising:
 a semiconductor substrate including a first conductivity-type drift layer and a second conductivity-type base layer disposed on the drift layer, a surface of the drift layer opposite to the base layer defining a first surface of the semiconductor substrate, a surface of the base layer opposite to the drift layer defining a second surface of the semiconductor substrate;
 a second conductivity-type collector layer disposed adjacent to the second surface of the semiconductor substrate;
 a first conductivity-type cathode layer disposed adjacent to the second surface of the semiconductor substrate at a same level as the collector layer; and
 a collector electrode disposed on the collector layer and the cathode layer, wherein
  a section of the semiconductor substrate including the collector layer with respect to a direction along the first surface constitutes an IGBT cell operating as an IGBT element and a section of the semiconductor substrate including the cathode layer with respect to the direction along the first surface constitutes a diode cell operating as a diode element, wherein the IGBT cell includes:
 a trench passing through the base layer and reaching the drift layer;
 a gate insulating film disposed on an inner surface of the trench;
 a gate electrode disposed on the gate insulating film within the trench;
 a first conductivity-type emitter region disposed in a surface portion of the base layer, the emitter region contacting a side surface of the trench within the base layer;
 a second conductivity-type first contact region disposed in the surface portion of the base layer;
 a first conductivity-type floating layer disposed within the base layer at a location deeper than the emitter region and the first contact region with respect to a depth of the trench, the floating layer separating the base layer into a first portion including the emitter region and the first contact region and a second portion adjacent to the drift layer; and
 an interlayer insulating film disposed to cover an end of the gate electrode, the diode cell includes a second conductivity-type second contact region disposed in the surface portion of the base layer,
the IGBT cell and the diode cell further include an emitter electrode that is electrically connected to the emitter region, the first contact region and the second contact region, and
the diode cell further includes:
 a trench passing through the base layer and reaching the drift layer;
 a gate insulating film disposed on an inner surface of the trench; and
 a trench electrode disposed on the gate insulating film within the trench, and
 the trench electrode is electrically connected to the emitter electrode to provide an emitter-ground structure.
2. The semiconductor device according to claim 1, wherein in the diode cell, the emitter electrode is disposed on the trench electrode to directly electrically connect between the emitter electrode and the trench electrode.
3. The semiconductor device according to claim 1, wherein the diode cell includes an interlayer insulating film disposed on the first surface to cover an end of the trench electrode,
the trench of the diode cell extends in a direction along the first surface of the semiconductor substrate, and
the trench electrode is electrically connected to the emitter electrode at an end of the trench of the diode cell with respect to a longitudinal direction of the trench of the diode cell.
4. The semiconductor device according to claim 1, wherein the diode cell includes an interlayer insulating film disposed on the first surface to cover an end of the trench electrode,
the trench of the diode cell extends in a direction along the first surface of the semiconductor substrate, and
the IGBT cell and the diode cell include a control electrode that is electrically connected to the trench electrode at an end of the trench of the diode cell with respect to a longitudinal direction of the trench of the diode cell.
5. The semiconductor device according to claim 1, wherein the IGBT cell and the diode cell include a gate leading electrode,
the trench of the IGBT cell and the trench of the diode cell extend in a direction along the first surface of the semiconductor substrate, and the gate leading electrode electrically connects the gate electrode and the trench electrode at ends of the trenches with respect to the longitudinal direction of the trenches.

6. The semiconductor device according to claim 1, wherein the IGBT cell includes a plurality of trenches, and one of the trenches is located on a boundary line between the collector layer and the cathode layer,
the gate electrode disposed in the one is electrically insulated from the emitter electrode by the interlayer insulating film, and
the one defines a boundary between the IGBT cell and the diode cell.

7. The semiconductor device according to claim 1, wherein the floating layer is disposed in the IGBT cell and is extended toward the diode cell beyond a boundary line between the collector layer and the cathode layer.

8. The semiconductor device according to claim 1, wherein the floating layer is disposed throughout the IGBT cell and the diode cell.

9. A semiconductor device comprising:
a semiconductor substrate including a first conductivity-type drift layer and a second conductivity-type base layer disposed on the drift layer, a surface of the drift layer opposite to the base layer defining a first surface of the semiconductor substrate, a surface of the base layer opposite to the drift layer defining a second surface of the semiconductor substrate;
a second conductivity-type collector layer disposed adjacent to the second surface of the semiconductor substrate;
a first conductivity-type cathode layer disposed adjacent to the second surface of the semiconductor substrate at a same level as the collector layer; and
a collector electrode disposed on the collector layer and the cathode layer, wherein
a section of the semiconductor substrate including the collector layer with respect to a direction along the first surface constitutes an IGBT cell operating as an IGBT element and a section of the semiconductor substrate including the cathode layer with respect to the direction along the first surface constitutes a diode cell operating as a diode element, wherein
the IGBT cell includes:
a trench passing through the base layer and reaching the drift layer;
a gate insulating film disposed on an inner surface of the trench;
a gate electrode disposed on the gate insulating film within the trench;
a first conductivity-type emitter region disposed in a surface portion of the base layer, the emitter region contacting a side surface of the trench within the base layer;
a second conductivity-type first contact region disposed in the surface portion of the base layer;
a first conductivity-type floating layer disposed within the base layer at a location deeper than the emitter region and the first contact region with respect to a depth of the trench, the floating layer separating the base layer into a first portion including the emitter region and the first contact region and a second portion adjacent to the drift layer; and
an interlayer insulating film disposed to cover an end of the gate electrode,
the diode cell includes a second conductivity-type second contact region disposed in the surface portion of the base layer,
the IGBT cell and the diode cell further include an emitter electrode that is electrically connected to the emitter region, the first contact region and the second contact region,
a first end portion of the base layer of the IGBT cell and a second end portion of the base layer of the diode cell are configured without having the emitter region, the first end portion being located at an end of the IGBT cell adjacent to the diode cell, the second end portion being located at an end of the diode cell adjacent to the IGBT cell, and
each of the first end portion and the second end portion is formed with the first contact region and the floating layer.

10. A semiconductor device comprising:
a semiconductor substrate including a first conductivity-type drift layer and a second conductivity-type base layer disposed on the drift layer, a surface of the drift layer opposite to the base layer defining a first surface of the semiconductor substrate, a surface of the base layer opposite to the drift layer defining a second surface of the semiconductor substrate;
a second conductivity-type collector layer disposed adjacent to the second surface of the semiconductor substrate;
a first conductivity-type cathode layer disposed adjacent to the second surface of the semiconductor substrate at a same level as the collector layer; and
a collector electrode disposed on the collector layer and the cathode layer, wherein
a section of the semiconductor substrate including the collector layer with respect to a direction along the first surface constitutes an IGBT cell operating as an IGBT element and a section of the semiconductor substrate including the cathode layer with respect to the direction along the first surface constitutes a diode cell operating as a diode element, wherein
the IGBT cell includes:
a trench passing through the base layer and reaching the drift layer;
a gate insulating film disposed on an inner surface of the trench;
a gate electrode disposed on the gate insulating film within the trench;
a first conductivity-type emitter region disposed in a surface portion of the base layer, the emitter region contacting a side surface of the trench within the base layer;
a second conductivity-type first contact region disposed in the surface portion of the base layer;
a first conductivity-type floating layer disposed within the base layer at a location deeper than the emitter region and the first contact region with respect to a depth of the trench, the floating layer separating the base layer into a first portion including the emitter region and the first contact region and a second portion adjacent to the drift layer; and
an interlayer insulating film disposed to cover an end of the gate electrode,
the diode cell includes a second conductivity-type second contact region disposed in the surface portion of the base layer,
the IGBT cell and the diode cell further include an emitter electrode that is electrically connected to the emitter region, the first contact region and the second contact region, and an end portion of the base layer of the IGBT cell is configured without having the floating layer, the end portion being located at an end of the IGBT cell adjacent to the diode cell.

11. A semiconductor device comprising:
a semiconductor substrate including a first conductivity-type drift layer and a second conductivity-type base layer disposed on the drift layer, a surface of the drift layer opposite to the base layer defining a first surface of the semiconductor substrate, a surface of the base layer opposite to the drift layer defining a second surface of the semiconductor substrate;
a second conductivity-type collector layer disposed adjacent to the second surface of the semiconductor substrate;
a first conductivity-type cathode layer disposed adjacent to the second surface of the semiconductor substrate at a same level as the collector layer; and
a collector electrode disposed on the collector layer and the cathode layer, wherein
a section of the semiconductor substrate including the collector layer with respect to a direction along the first surface constitutes an IGBT cell operating as an IGBT element and a section of the semiconductor substrate including the cathode layer with respect to the direction along the first surface constitutes a diode cell operating as a diode element, wherein
the IGBT cell includes:
a trench passing through the base layer and reaching the drift layer;
a gate insulating film disposed on an inner surface of the trench;
a gate electrode disposed on the gate insulating film within the trench;
a first conductivity-type emitter region disposed in a surface portion of the base layer, the emitter region contacting a side surface of the trench within the base layer;
a second conductivity-type first contact region disposed in the surface portion of the base layer;
a first conductivity-type floating layer disposed within the base layer at a location deeper than the emitter region and the first contact region with respect to a depth of the trench, the floating layer separating the base layer into a first portion including the emitter region and the first contact region and a second portion adjacent to the drift layer; and
an interlayer insulating film disposed to cover an end of the gate electrode,
the diode cell includes a second conductivity-type second contact region disposed in the surface portion of the base layer,
the IGBT cell and the diode cell further include an emitter electrode that is electrically connected to the emitter region, the first contact region and the second contact region, and
the second contact region has an impurity concentration different from that of the first contact region.

12. A semiconductor device comprising:
a semiconductor substrate including a first conductivity-type drift layer and a second conductivity-type base layer disposed on the drift layer, a surface of the drift layer opposite to the base layer defining a first surface of the semiconductor substrate, a surface of the base layer opposite to the drift layer defining a second surface of the semiconductor substrate;
a second conductivity-type collector layer disposed adjacent to the second surface of the semiconductor substrate;
a first conductivity-type cathode layer disposed adjacent to the second surface of the semiconductor substrate at a same level as the collector layer; and
a collector electrode disposed on the collector layer and the cathode layer, wherein
a section of the semiconductor substrate including the collector layer with respect to a direction along the first surface constitutes an IGBT cell operating as an IGBT element and a section of the semiconductor substrate including the cathode layer with respect to the direction along the first surface constitutes a diode cell operating as a diode element, wherein
the IGBT cell includes:
a trench passing through the base layer and reaching the drift layer;
a gate insulating film disposed on an inner surface of the trench;
a gate electrode disposed on the gate insulating film within the trench;
a first conductivity-type emitter region disposed in a surface portion of the base layer, the emitter region contacting a side surface of the trench within the base layer;
a second conductivity-type first contact region disposed in the surface portion of the base layer;
a first conductivity-type floating layer disposed within the base layer at a location deeper than the emitter region and the first contact region with respect to a depth of the trench, the floating layer separating the base layer into a first portion including the emitter region and the first contact region and a second portion adjacent to the drift layer; and
an interlayer insulating film disposed to cover an end of the gate electrode,
the diode cell includes a second conductivity-type second contact region disposed in the surface portion of the base layer,
the IGBT cell and the diode cell further include an emitter electrode that is electrically connected to the emitter region, the first contact region and the second contact region,
the base layer provides a second conductivity-type RESURF region at least in the diode cell, the RESURF region having a depth greater than that of the trench of the IGBT cell at least at a location adjacent to a boundary between the IGBT cell and the diode cell and having an area density smaller than that of the base layer of the IGBT cell, and
the second contact region is disposed in a surface portion of the RESURF region.

13. A semiconductor device comprising:
a semiconductor substrate defining a first surface and a second surface, the semiconductor substrate including a first conductivity-type drift layer;
a second conductivity-type collector layer disposed adjacent to the second surface of the semiconductor substrate;
a first conductivity-type cathode layer disposed adjacent to the second surface of the semiconductor substrate at a same level as the collector layer; and
a collector electrode disposed on the collector layer and the cathode layer, wherein
a section of the semiconductor substrate including the collector layer with respect to a direction along the first surface constitutes an IGBT cell operating as an IGBT element and a section of the semiconductor substrate including the cathode layer with respect to the direction along the first surface constitutes a diode cell operating as a diode element, wherein the IGBT cell includes:
  a second conductivity-type channel layer disposed on the drift layer;
  a trench passing through the channel layer and reaching the drift layer;
  a gate insulating film disposed on an inner surface of the trench;
  a gate electrode disposed on the gate insulating film within the trench;
  a first conductivity-type emitter region disposed in the surface portion of the channel layer and contacting a side surface of the trench within the channel layer;
  a second conductivity-type first contact region disposed in the surface portion of the channel layer;
  a first conductivity-type floating layer disposed in the channel layer at a location deeper than the emitter region and the first contact region, the floating layer separating the channel layer into a first portion including the emitter region and the first contact region and a second portion adjacent to the drift layer; and
  an interlayer insulating film disposed to cover an end of the gate electrode, and the diode cell includes:
  a second conductivity-type RESURF region having an area density lower than that of the channel layer and having a depth greater than that of the trench at least at a location adjacent to a boundary between the IGBT cell and the diode cell, the RESURF region serving as an anode; and
  a second conductivity-type second contact region disposed in a surface portion of the RESURF region.

14. The semiconductor device according to claim 13, wherein
  the channel layer of the IGBT cell overlaps the RESURF region of the diode cell within the diode cell with respect to a direction perpendicular to the first surface of the semiconductor substrate.

15. The semiconductor device according to claim 13, wherein
  the RESURF region of the diode cell overlaps the channel layer of the IGBT cell within the IGBT cell with respect to a direction perpendicular to the first surface of the semiconductor substrate.

16. The semiconductor device according to claim 13, wherein
  the trench extends in a direction perpendicular to an alignment direction of the IGBT cell and the diode cell, and
  the second contact region is disposed intermittently in the longitudinal direction of the trench and in the alignment direction of the IGBT cell and the diode cell.

17. The semiconductor device according to claim 13, wherein
  the trench extends in a direction perpendicular to an alignment direction of the IGBT cell and the diode cell, and
  the second contact region is disposed in a striped shape along the alignment direction of the IGBT cell and the diode cell.

18. The semiconductor device according to claim 13, wherein
  the trench extends in a direction perpendicular to an alignment direction of the IGBT cell and the diode cell, and
  the RESURF region is disposed in a striped shape along the alignment direction of the IGBT cell and the diode cell.

19. The semiconductor device according to claim 18, wherein
  the trench extends in a direction perpendicular to an alignment direction of the IGBT cell and the diode cell,
  the RESURF region is disposed in a striped shape along the alignment direction of the IGBT cell and the diode cell, and
  the second contact region is disposed in a striped shape along the RESURF region, and each of stripe portions of the second contact region covers a predetermined number of stripe portions of the RESURF region.

* * * * *